(12) United States Patent
Kimura et al.

(10) Patent No.: US 7,085,440 B2
(45) Date of Patent: Aug. 1, 2006

(54) SEMICONDUCTOR LASER MODULE AND OPTICAL AMPLIFIER

(75) Inventors: Toshio Kimura, Tokyo (JP); Masashi Nakae, Tokyo (JP)

(73) Assignee: The Furukawa Electric Co., LTD, Tokyo (JP)

( * ) Notice: Subject to any disclaimer, the term of this patent is extended or adjusted under 35 U.S.C. 154(b) by 63 days.

(21) Appl. No.: 10/476,871

(22) PCT Filed: Jul. 2, 2002

(86) PCT No.: PCT/JP02/06677

§ 371 (c)(1),
(2), (4) Date: Jun. 3, 2004

(87) PCT Pub. No.: WO03/005106

PCT Pub. Date: Jan. 16, 2003

(65) Prior Publication Data
US 2004/0240767 A1    Dec. 2, 2004

(30) Foreign Application Priority Data

| Jul. 2, 2001 | (JP) | 2001-201513 |
| Jul. 17, 2001 | (JP) | 2001-217265 |
| Oct. 23, 2001 | (JP) | 2001-325705 |
| Apr. 22, 2002 | (JP) | 2002-118796 |

(51) Int. Cl.
*G02B 6/00* (2006.01)
*G02B 6/36* (2006.01)
*G02B 6/38* (2006.01)
*G02B 5/30* (2006.01)
*G02B 27/28* (2006.01)

(52) U.S. Cl. ............... 385/11; 385/88; 385/92; 385/93; 385/65; 385/79; 385/82; 359/483; 359/494; 359/496

(58) Field of Classification Search ............... 385/11, 385/88–93, 65, 79, 82; 359/483–502, 333
See application file for complete search history.

(56) References Cited

U.S. PATENT DOCUMENTS 4,805,977 A    2/1989    Tamura et al.
5,589,684 A    12/1996    Ventrudo et al.

(Continued)

FOREIGN PATENT DOCUMENTS

| EP | 268523 | 5/1988 |
| EP | 312652 | 4/1989 |

(Continued)

OTHER PUBLICATIONS

Yoshihiro Emori, et al., "Demonstration of Broadband Raman Amplifiers: a Promising Application of High-power Pumping Unit", http://www.furukawa.co.jp/review/backnum.htm, WDM Team. Opto-technology Lab., R & D Div. No. 19, Apr. 2000, pp. 42-45 (with English translation).
Patent Abstracts of Japan, JP 62-189422, Aug. 19, 1987.

*Primary Examiner*—Brian Healy
*Assistant Examiner*—Charlie Peng
(74) *Attorney, Agent, or Firm*—Oblon, Spivak, McClelland, Maier & Neustadt, P.C.

(57) ABSTRACT

A semiconductor laser module includes a polarization direction transforming part which transforms polarization directions of first and second laser beams such that they are orthogonal to each other even if a polarization dependent optical isolator is utilized in the semiconductor laser module. The configuration allows the two laser beams to propagate through the birefringence element to the output port without each splitting into an ordinary ray and an extraordinary ray on entering the birefringence element, and therefore free from decrease of optical power reaching the output port. Thus, high power semiconductor laser modules can be provided.

22 Claims, 27 Drawing Sheets

U.S. PATENT DOCUMENTS

| | | |
|---|---|---|
| 5,692,082 A | 11/1997 | Fukushima |
| 6,362,919 B1 * | 3/2002 | Flanders ................. 359/497 |
| 6,404,542 B1 * | 6/2002 | Ziari et al. ............. 359/341.3 |
| 6,600,597 B1 * | 7/2003 | Beeson ................... 359/342 |
| 6,847,742 B1 * | 1/2005 | Sorin ........................ 385/7 |
| 2001/0008463 A1 * | 7/2001 | Cao ......................... 359/497 |

FOREIGN PATENT DOCUMENTS

| | | |
|---|---|---|
| EP | 1 085 622 A1 | 3/2001 |
| JP | 60-76707 | 5/1985 |
| JP | 62-189422 | 8/1987 |
| JP | 63-115145 | 5/1988 |
| JP | 1-291480 | 11/1989 |
| JP | 3-135511 | 6/1991 |
| JP | 4-180282 | 6/1992 |
| JP | 4-369888 | 12/1992 |
| JP | 5-53082 | 3/1993 |
| JP | 5-121838 | 5/1993 |
| JP | 07-072426 * | 3/1995 |
| JP | 7-72426 | 3/1995 |
| JP | 7-99477 | 4/1995 |
| JP | 8-248259 | 9/1996 |
| JP | 8-254668 | 10/1996 |
| JP | 9-162490 | 6/1997 |
| JP | 9-214022 | 8/1997 |
| JP | 10-62720 | 3/1998 |
| JP | 2000-31575 | 1/2000 |
| JP | 2001-59925 | 3/2001 |
| JP | 2002-023019 | 1/2002 |

* cited by examiner

Fig. 4 (A)
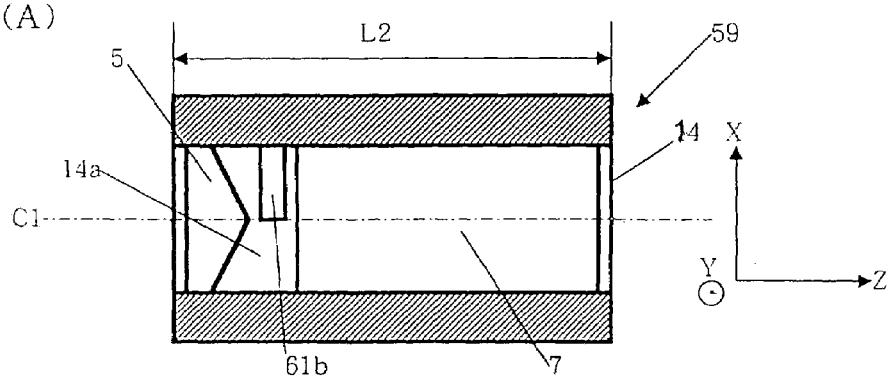
Fig. 4 (B)
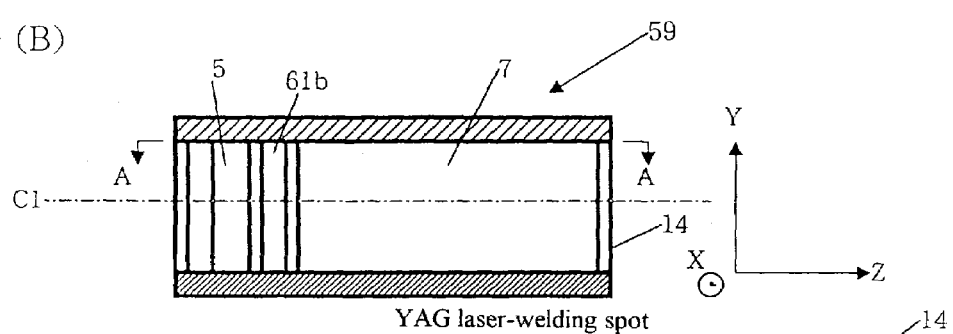
YAG laser-welding spot
Fig. 4 (C)
Fig. 4 (D)
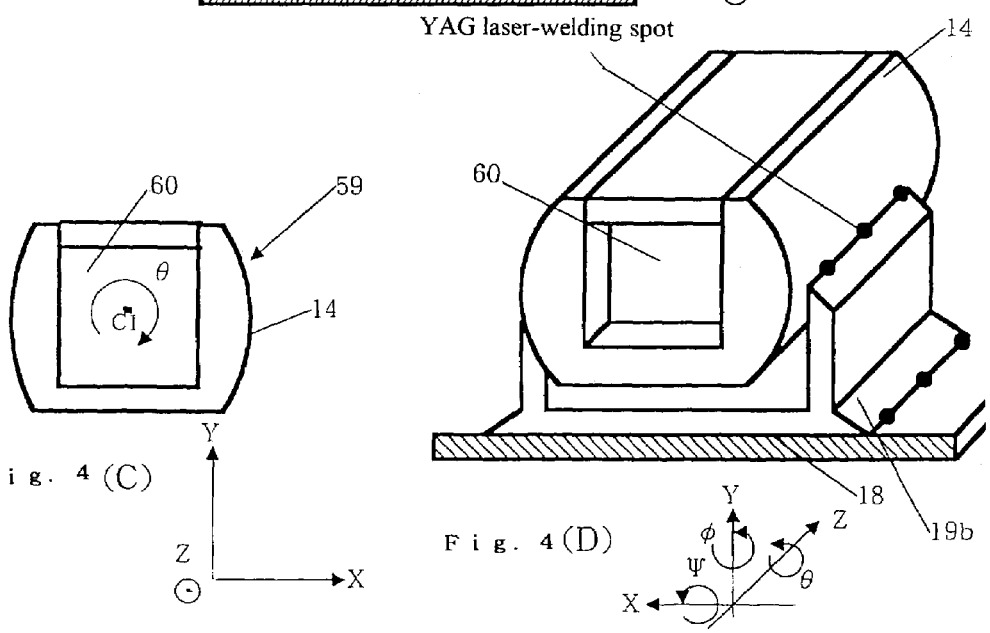

Fig. 21
(RELATED ART)
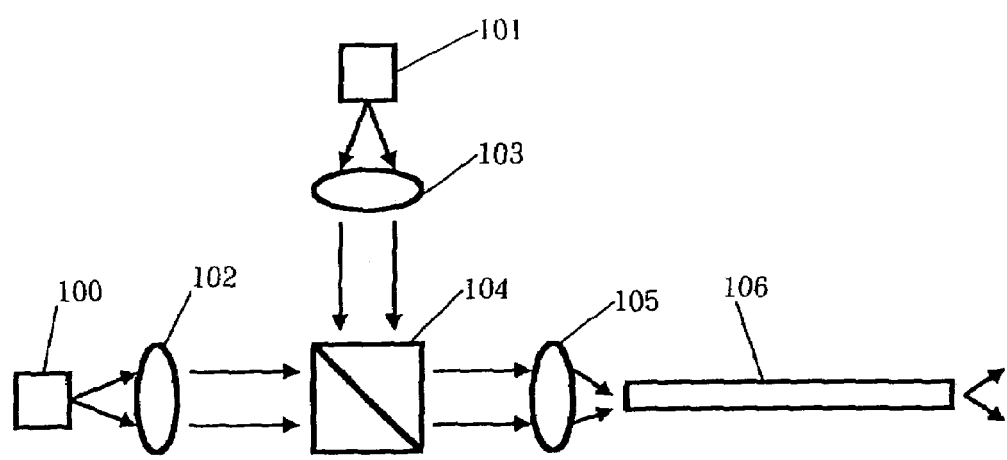
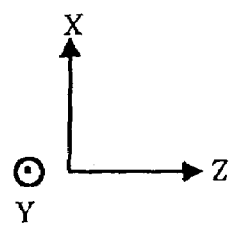

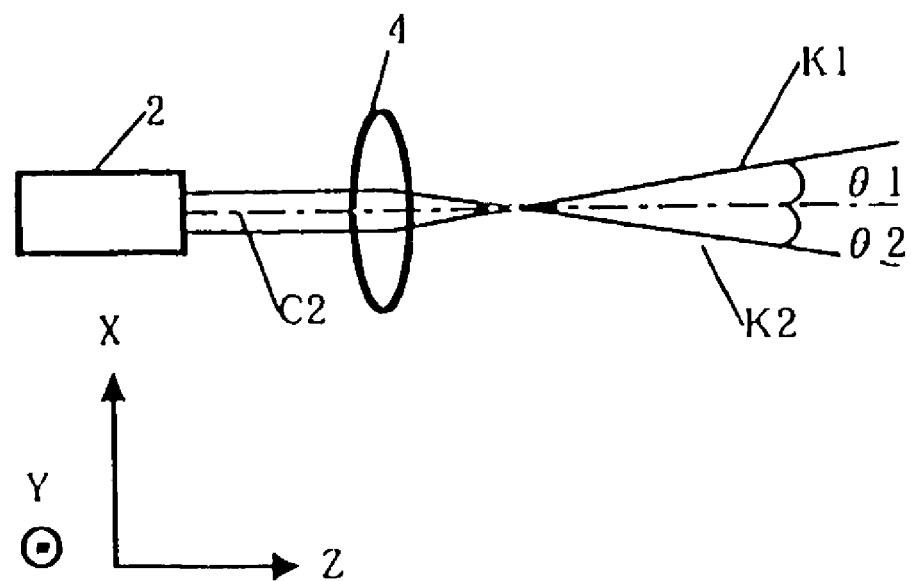
Fig. 27 (A)
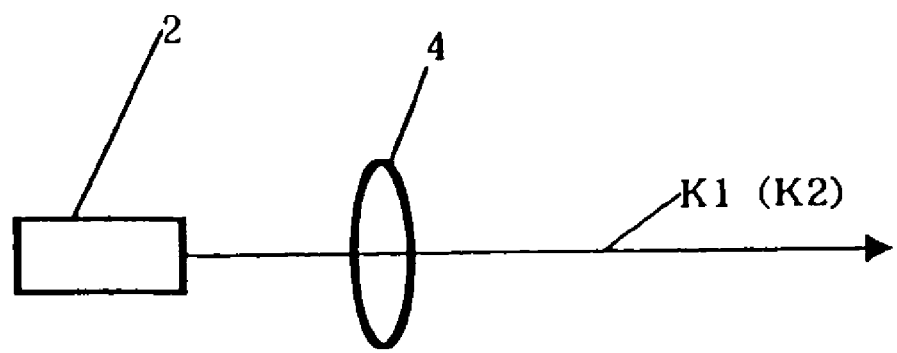
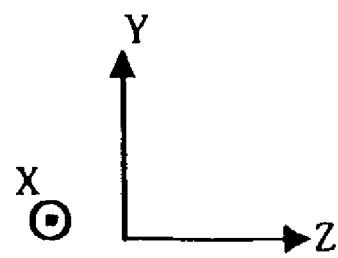
Fig. 27 (B)

SEMICONDUCTOR LASER MODULE AND OPTICAL AMPLIFIER

TECHNICAL FIELD

The present invention relates to a semiconductor laser module and an optical fiber amplifier. More particularly, the present invention relates to a semiconductor laser module and an optical fiber amplifier including two laser beams polarization-synthesized and then coupled to an optical fiber.

BACKGROUND ART

With progress in the optical communications based on a dense wavelength division multiplexing transmission system over the recent years, a higher output is increasingly demanded to a pumping light source used for the optical amplifier.

Further, a greater expectation is recently given to a Raman amplifier as an amplifier for amplifying the light having a much broader band than by an erbium-doped optical amplifier that has hitherto been employed as the optical amplifier. The Raman amplifier may be defined as a method of amplifying the optical signals, which utilizes such a phenomenon that a gain occurs on the side of frequencies as low as 13 THz on the basis of a pumping wavelength due to the stimulated Raman scattering occurred when the pumping beams enter an optical fiber, and, when the signal beams having the wavelength range containing the gain described above are inputted to the optical fiber in the thus excited state, these signals are amplified.

According to the Raman amplification, the signal beams are amplified in a state where a polarization direction of the signal beams is coincident with a polarization direction of the pumping beams, and it is therefore required that an influence by a deviation between polarization directions of the signal beams and of the pumping beams be minimized. For attaining this, a degree of polarization (DOP) has hitherto been reduced by obviating the polarization of the pumping beams, which may be called depolarization.

As a method for depolarizing a laser beam emitted from a conventional semiconductor laser module used as a pumping light source or so in the optical fiber amplifier, one in which two laser beams are polarization-synthesized and output from an optical fiber is known.

FIG. 21 is an explanatory diagram showing a conventional semiconductor laser apparatus as disclosed in U.S. Pat. No. 5,589,684.

As shown in FIG. 21, the conventional semiconductor laser apparatus comprises a first semiconductor laser device 100 and a second semiconductor laser device 101 each emitting a laser beam of the same wavelength in a direction vertical to the other; a first collimating lens 102 configured to collimate the laser beam emitted from the first semiconductor laser device 100; a second collimating lens 103 configured to collimate the laser beam emitted from the second semiconductor laser device 101; a polarization-synthesizing coupler 104 configured to polarization-synthesize the orthogonally polarized laser beams that were collimated by the first collimating lens 102 and the second collimating lens 103; a convergent lens 105 configured to converge the laser beams polarization-synthesized by the polarization-synthesizing coupler 104; and an optical fiber 106 for receiving the laser beams converged by the convergent lens 105 and letting the laser beams travel outside.

In the conventional semiconductor laser apparatus, the laser beams are emitted from the first semiconductor laser device 100 and the second semiconductor laser device 101 in mutually vertical directions and are polarization-synthesized by the polarization-synthesizing coupler 104 to obtain a laser beam of reduced DOP from the optical fiber 106. (This technology will hereinafter be called a prior art 1.) In addition, Japanese Patent Application Laid-open No. Sho 60-76707 discloses a semiconductor laser module including a first and a second semiconductor laser devices disposed on a heat sink and emitting a first and a second laser beam respectively with mutually parallel optical axes and mutually parallel polarization directions from a substantially identical light-emitting end faces; a polarization rotator disposed on an optical path of the first laser beam emitted from the first semiconductor laser device and configured to rotate the polarization direction of the first laser beam by 90 degrees such that it is orthogonal to the polarization direction of the second laser beam; a polarization element (calcite, etc.) merging optical paths of the first and second laser beam of mutually orthogonal polarizations based on its birefringence effect; an optical fiber for receiving the laser beams emerging from the polarization element and letting the laser beams travel outside; and a lens for coupling the laser beams merged through the polarization element to the optical fiber. In the semiconductor laser module of this prior art, the first and second semiconductor laser devices are housed in a package to form an unit. (This technology will hereinafter be called a prior art 2.)

Further, Japanese Patent Application Laid-open No. 2000-31575 discloses a semiconductor laser module including a thermoelectric cooler; a first and a second semiconductor laser devices mounted on the thermoelectric cooler; a first and a second lenses each for collimating the first and second laser beams emitted from the first and second semiconductor laser devices; a polarization-synthesizer for synthesizing the first and second laser beams; and an optical fiber for receiving the laser beams emerging from the polarization synthesizer and letting the laser beams travel outside. Moreover, the first and second semiconductor laser devices are formed in an LD array, in which the laser diodes are arrayed at a pitch between their light-emitting centers (hereinafter referred to as inter-emission-center pitch) of 500 μm. Further, the first and second convergent lenses are formed in a lens array such as a ball lens array or a Fresnel lens array. (This technology will hereinafter be called a prior art 3.)

However, in the prior art 1, the lenses have to be aligned with respect to the respective laser beams emitted from the two semiconductor laser devices, which makes the manufacturing process complicated and requires a long time to manufacture.

In the prior art 2, the laser beams from the semiconductor laser device are directly received by a polarization rotator or a polarization element. The configuration therefore requires that a spacing between the semiconductor laser device and the lens be set to 300 to 500 μm or so in order to achieve a high coupling efficiency. It is difficult in practical point of view, however, to dispose the polarization rotator and the polarization element between the semiconductor laser device and the lens. Adopting a larger lens would create a larger space, but this approach will have a problem that a package needs to be larger in size than currently used, resulting in the semiconductor laser module being larger in size.

Further, in the prior art 3, two laser beams emitted at a wide interval (i.e. the inter-emission-center pitch of 500 μm) are respectively received by the separate lenses from each other and are made mutually parallel. The configuration has a problem that it is unsuitable for mass production since semiconductor laser devices are large in size and not obtained in large quantity from a single wafer. Narrowing a spacing between the stripes of the semiconductor laser device in order to obviate the above problem would need to accompany downsizing of the lenses, making it difficult to separate the laser beams emitted from the stripes and polarization-synthesizing or optical synthesizing of the beams that follows.

In order to solve the above problem, the applicant of the present invention has proposed a semiconductor laser module in which two laser beams emitted from two light-emitting stripes (hereinafter referred to simply as stripes) formed in a single semiconductor laser device are polarization-synthesized and received by an optical fiber. (See Japanese patent application No. 2001-383840, for example. This technology will hereinafter be called a related art.)

FIG. 22 is an explanatory diagram schematically showing a configuration of the semiconductor laser module of the related art.

As shown in FIG. 22, the semiconductor laser module M11 of the related art includes a single semiconductor laser device 2 having a first stripe 9 and a second stripe 10 formed in parallel to each other with a spacing of 100 μm or less interposed therebetween and emitting a first laser beam K1 and a second laser beam K2 from a front end face (i.e. an end face on right-hand side in FIG. 22) of the first stripe 9 and the second stripe 10 respectively; a first lens 4 positioned so that the first laser beam K1 and the second laser beam K2 are incident therealong and configured to separate the first laser beam K1 and the second laser beam K2 in the direction in which the first and second stripes 9, 10 are arrayed; a half-wave plate 6 (a polarization rotating means) configured to rotate a polarization direction of at least one of the first and second laser beam K1, K2 (i.e. the first laser beam K1 in FIG. 22) by a predetermined angle (by 90 degrees, for example); a birefringence element 7 configured to optically synthesize therealong the first laser beam K1 and the second laser beam K2; and an optical fiber 8 optically coupled to the synthesized laser beams emerging from the birefringence element 7 and letting the synthesized beams to travel outside.

In addition, a prism 5 is disposed between the first lens 4 and the half-wave plate 6 so that the first laser beam K1 and the second laser beam K2 are incident thereon and output therefrom along their respective optical axes parallel to each other. Further, a second lens 16 is disposed between the birefringence element 7 and the optical fiber 8 in order to optically couple the first and second laser beams K1, K2 polarization-synthesized by the birefringence element 7 to the optical fiber 8 which is supported by a ferrule 23.

The birefringence element 7 may be formed of a crystal such as rutile or YVO4.

The first laser beam K1 and the second laser beam K2 emitted respectively from the front end face 2a of the first stripe 9 and the second stripe 10 of the semiconductor laser device 2 travel through the first lens 4, intersect and separate until the separation between the two beams is enough, before entering the prism 5.

During propagation through the prism 5, the first laser beam K1 and the second laser beam K2 are made parallel to each other with a spacing D interposed therebetween, and are emitted from the prism 5. The first laser beam K1 then enters the half-wave plate 6, where its polarization direction is rotated by 90 degrees, and then enters a first input port 7a of the birefringence element 7, while the second laser beam K2 enters a second input port 7b of the birefringence element 7.

The first laser beam K1 incident on the first input port 7a and the second laser beam K2 incident on the second input port 7b are polarization-synthesized along the birefringence element 7, and output from an output port 7c.

The laser beams emerging from the birefringence element 7 are then converged by the second lens 16, enter an end face of the optical fiber 8 supported by the ferrule 23, and propagate to outside.

According to the semiconductor laser module M1 of the related art, a first laser beam K1 and a second laser beam K2 polarized in identical directions are emitted from a first and a second stripes 9, 10 formed in a single semiconductor laser device 2 with an interval of 100 μm or less, and are sufficiently separated by a first lens 4. Thereafter, the first laser beam K1 experiences a rotation of its polarization direction by 90 degrees through a half-wave plate 6, when the polarization directions of the laser beams K1, K2 are orthogonal to each other. The first laser beam K1 and the second laser beam K2 are then polarization-synthesized along a birefringence element 7, and therefore, a high power laser beam of reduced DOP can be output from an optical fiber 8.

The above described semiconductor laser module M1 can therefore be utilized as a pumping light source for use in erbium-doped optical fiber amplifiers (EDFA's) demanding high output, or further in Raman amplifiers in which the low polarization dependency and the stability of amplification gain are required.

In addition, since it comprises the single semiconductor laser device 2 with the two stripes each emitting one laser beam and the single first lens 4 configured to mutually separate the laser beams K1 and K2, it takes less time to align the semiconductor laser device 2 and the first lens 4. Consequently, manufacturing time of the semiconductor laser module M1 can be shorter.

Further, since the two laser beams emitted from the single semiconductor laser device 2 travel in substantially identical directions, the optical output obtained from the optical fiber 8 can be stabilized by suppressing a warpage of a package, accommodating the semiconductor laser device 2, the first lens 4, the half-wave plate 6, the birefringence element 7, the second lens 16, etc., along only one direction (i.e. along Z-direction in FIG. 22).

Here, in the semiconductor laser module M11 of the related art, it is often required that an optical isolator 108 be interposed between the first lens 4 and the second lens 16, as shown by the broken lines in FIG. 22, allowing the first laser beam K1 and the second laser beam K2 emitted from the semiconductor laser device 2 to pass through only toward the optical fiber 8 for the purpose of preventing a reflected beam from the optical fiber 8 and thereby stabilizing the operation of the semiconductor laser device 2.

It is generally known that the optical isolator is classified into the polarization-independent isolator which permits an incident beam to pass through only in one direction irrespective of the polarization state of the incident beam, and the polarization-dependent isolator constituted by placing a Faraday rotator between input and output polarizers. The polarization-dependent isolator is further classified into one in which, referring to FIG. 23(A), a Faraday rotator 66 is interposed between a pair of polarizers 65, 65 and in which the polarization direction of the output beam is rotated by 45 degrees with respect to the input beam (hereinafter called 'single type'), one in which, referring to FIG. 23(B), each of the two Faraday rotators 66a, 66b is interposed between two of the three polarizers 65 (hereinafter called 'semi-double type') and one in which, referring to FIG. 23(C), each of the two Faraday rotators 66a, 66b is interposed between two of the four polarizers 65 (hereinafter called 'double type'). In the semi-double and double type isolators, the Faraday rotator 66a rotates the polarization of the incident beam by 45 degrees while the Faraday rotator 66b rotates the polarization of the beam emerging from the intermediate polarizer 65 by 45 degrees either in the same azimuthal direction as the Faraday rotator 66a or in the opposite to. Therefore, the polarization of the output beam is rotated either by 90 degrees or 0 degree. Additionally, in the double type isolator, a larger isolation is available due to one extra polarizer 65 added to the semi-double type.

The single type polarization dependent isolator has often been used in the semiconductor laser module because of its compactness, low loss and sufficient isolation characteristics as compared with the semi-double and double type polarization dependent isolators.

However, if the single type polarization isolator is used in the semiconductor laser module M11 of the above described related art, the laser beams will experience rotations of their polarizations by 45 degrees through the optical isolator 108, resulting in the laser beams K1, K2, having traveled through the prism 5 and the half wave plate 6, being split into ordinary rays K1n, K2n and extraordinary rays K1a, K2b upon incidence on the birefringence element 7. These rays propagate through the birefringence element 7, and as a consequence, the polarized rays depicted by dotted lines fail to reach the output port 7c, resulting in a reduced intensity of the laser beam reaching the output port 7c and inability to obtain a high output semiconductor laser module. Note that the bilateral arrows in FIG. 22 shows polarization directions of the laser beams as viewed from the optical fiber 8.

DISCLOSURE OF THE INVENTION

The present invention is intended to solve the above problem. The object of the present invention is to provide a semiconductor laser module capable of outputting a synthesized laser beam of high intensity even when a polarization dependent optical isolator is used within the semiconductor laser module in which two laser beams are polarization-synthesized, and an optical amplifier using the semiconductor laser module.

The present invention provides a semiconductor laser module comprising: semiconductor laser devices emitting a first laser beam and a second laser beam polarized in mutually parallel directions; a first lens configured to transmit the first laser beam and said second laser beam emitted from the semiconductor laser devices; a polarization direction transforming part for transforming the polarization directions of the first and second laser beam emitted from the semiconductor laser devices such that they are orthogonal to each other, the polarization direction transforming part allowing the first and second laser beams to travel only in one direction; a polarization synthesizer including a first input port and a second input port on which the first and second laser beams emerging from the polarization direction transforming part are incident, respectively, and an output port from which the first and second laser beams incident on the first and second input ports are multiplexed and emitted; and an optical fiber for receiving the laser beams emitted from the output port of the polarization synthesizer and transmitting to outside.

The polarization direction transforming part includes an optical isolator part allowing the first and second laser beams to travel only in the one direction, and a polarization rotating part for rotating the polarization directions of the first and second laser beams such that they are orthogonal to each other.

The optical isolator part may include a polarization dependent optical isolator through which the polarization directions of the first and second laser beams incident on the optical isolator part are rotated by (45G2n) degrees in identical azimuthal directions, where n is an integer, when the polarization rotating part rotates the polarization direction of only one of the first and second laser beams emerging from the optical isolator part by 90 degrees.

The optical isolator part may include a polarization dependent optical isolator through which the polarization directions of the first and second laser beams incident on the optical isolator part are rotated by [45G (2m−1)] degrees in identical azimuthal directions, where m is an integer, when the polarization rotating part rotates the polarization directions of the first and second laser beams emerging from the optical isolator part by 45 degrees in mutually opposite azumuthal directions, respectively.

The optical isolator part may include a polarization dependent optical isolator through which the polarization directions of the first and second laser beams incident on the optical isolator part are rotated by [45G (2m−1)] degrees in identical azimuthal directions, where m is an integer, when the polarization rotating part includes a first rotating part for rotating the polarization directions of the first and second laser beams emerging from the optical isolator part by 45 degrees in identical azimuthal directions, and a second rotating part for rotating the polarization direction of only one of the first and second laser beams by 90 degrees.

The optical isolator part and the first rotating part may rotate the polarization in mutually opposite azimuthal directions.

The polarization synthesizer may be a birefringence element allowing any one of the first laser beam incident on the first input port and the second laser beam incident on the second input port to travel as an ordinary ray to the output port, while allowing the other to travel as an extraordinary ray to the output port.

The semiconductor laser devices may be a single semiconductor laser device having a first stripe and a second stripe formed with a spacing therebetween, wherein the first stripe and second stripe emit respectively the first laser beam and second laser beam polarized in mutually parallel directions from their respective one end faces.

The first lens may consist of a single lens positioned such that both of the first and second laser beams emitted from said semiconductor laser device are incident thereon and such that they separate in the direction in which the first and second stripes are arrayed as they travel away therefrom.

The semiconductor laser module may comprise a prism which is disposed between the first lens and the polarization synthesizer such that the first and second laser beams are incident thereon and emitted therefrom along their respective optical axes parallel to each other.

The prism may be disposed between said optical isolator part and the polarization rotating part.

Alternatively, the prism may be disposed between the first lens and the optical isolator part.

Alternatively, the prism may be disposed between the first rotating part and the second rotating part of the polarization rotating part.

The prism, the optical isolator part, the polarization rotating part and the birefringence element may be fixed to a common holder.

The optical isolator part may consist of a single polarization dependent optical isolator allowing both of the first and second laser beams to travel only in one direction.

The semiconductor laser devices may include diffraction gratings for selecting a light with a predetermined center wavelength.

The present invention also provides an optical amplifier including the above semiconductor laser module as a pumping light source for optical amplification.

The pumping light source may be used for Raman amplification.

BRIEF DESCRIPTION OF THE DRAWINGS

FIG. 4(A) is a plan sectional view of a polarization-synthesizing module taken along the line A—A in FIG. 4(B); FIG. 4(B) is a side sectional view thereof; FIG. 4(C) is a front view thereof; FIG. 4(D) is a perspective view thereof;

FIGS. 9(A) and (B) are explanatory diagrams showing a structure of a semiconductor laser device, of which

FIG. 21 is an explanatory diagram showing a conventional semiconductor laser apparatus as disclosed in U.S. Pat. No. 5,589,684;

FIGS. 27(A) and (B) are explanatory diagrams showing an alignment process of the first lens.

BEST MODE OF CARRYING OUT THE INVENTION

Embodiments of the present invention will hereinafter be described with reference to the accompanying drawings.

FIRST EMBODIMENT

Figure 1:
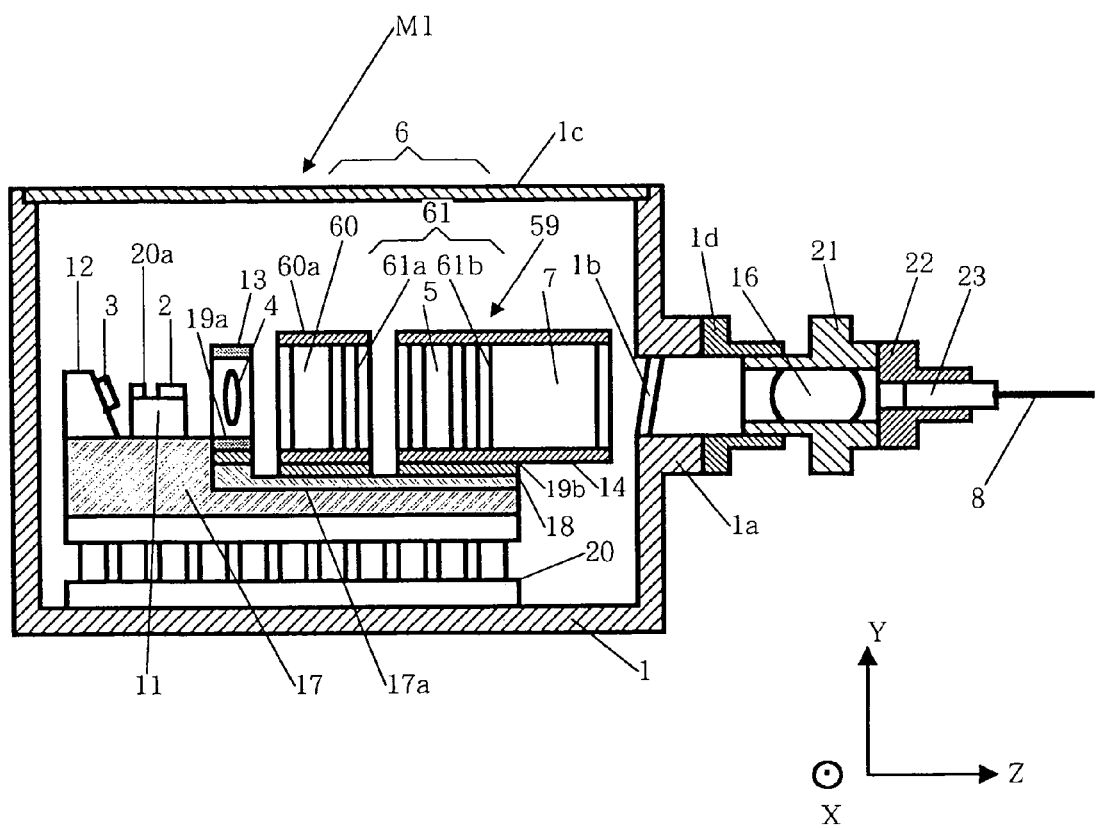
FIG. 1(A) is a side sectional view showing a configuration of a semiconductor laser module in accordance with a first embodiment of the present invention.
FIG. 1(B) is a side view showing a state where a semiconductor laser device is fixed onto a heat sink.
Figure 1:
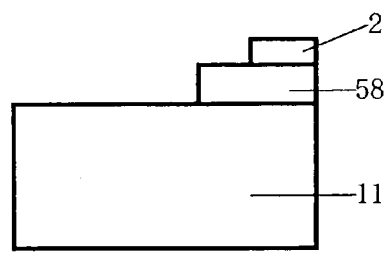
Figure 2:
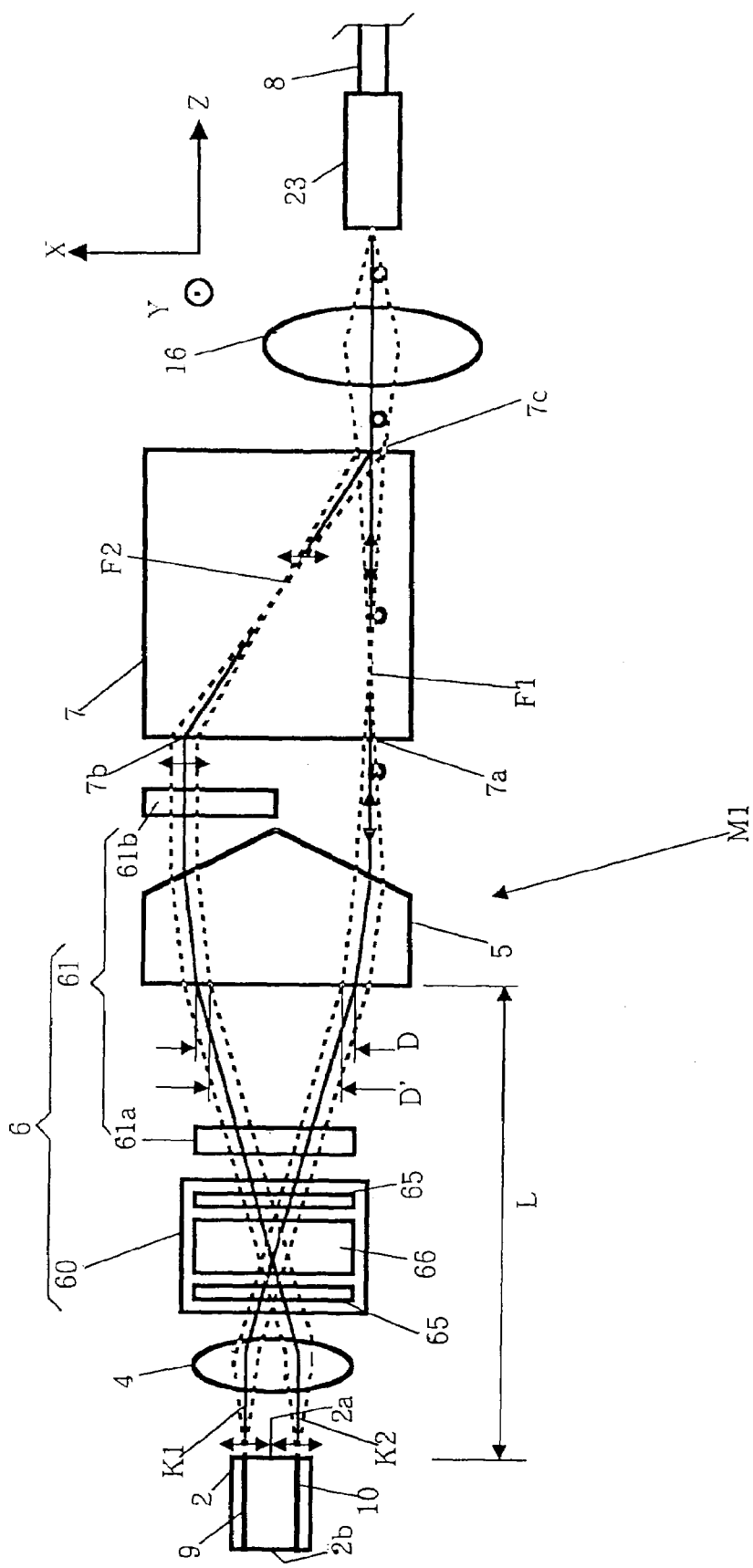
FIG. 2 is an explanatory diagram schematically showing a configuration of an optical system used in the semiconductor laser module in accordance with the first embodiment of the present invention.

FIG. 1(A) is a side sectional view showing a configuration of a semiconductor laser module in accordance with a first embodiment of the present invention, and FIG. 2 is an explanatory diagram schematically showing an optical system used in the semiconductor laser module in accordance with the first embodiment of the present invention.

As shown in FIG. 1(A), the semiconductor laser module in accordance with the first embodiment of the present invention has a package 1 hermetically sealing the internal space thereof, a semiconductor laser device 2 disposed in the package 1 and emitting laser beams, a photo diode (light-receiving element) 3, a first lens 4, a prism 5, a polarization direction transforming part 6, a birefringence element 7, and an optical fiber 8.

As shown in FIG. 2, the semiconductor laser device 2 has a first stripe 9 and a second stripe 10 formed coplanarly and extending in parallel to each other along their longitudinal directions with a spacing interposed therebetween, and a first laser beam K1 and a second laser beam K2 are emitted respectively from end faces of the first stripe 9 and the second stripe 10. The symbols K1 and K2 in FIG. 2 represent trajectories of centers of the laser beams emitted from the first and second stripe 9 and 10, respectively. The laser beams travels with some spread about their respective centers, as indicated by broken lines in FIG. 2. For the purpose of letting the beams K1 and K2 be incident on a single first lens 4, the spacing between the first stripe 9 and the second stripe is set to 100 μm or smaller, or about 40 to 60 μm for instance. The narrow spacing between the stripes makes the difference of optical output characteristics between the stripes less significant.

As shown in FIG. 1(A), the semiconductor laser device 2 is fixedly fitted onto a chip carrier 11. Note that the semiconductor laser device 2 emits the two laser beams K1 and K2, and is therefore more exothermic than a semiconductor laser device emitting a single laser beam. It is hence preferable that the semiconductor laser device 2 be fixedly fitted onto a heat sink 58 formed of a high thermal conductivity material such as diamond or so forth, which is fixedly fitted onto the chip carrier 11.

The photodiode 3 receives laser beams for monitoring, which are emitted from a rear (left side in FIG. 1(A)) end face 2b of the semiconductor laser device 2 (see FIG. 2). The photodiode 3 is fixedly attached to a photodiode carrier 12.

The first lens 4, on which the first laser beam K1 and the second laser beam K2 emitted from a front (right side in FIG. 1(A)) end face 2a of the semiconductor laser device 2 are incident (see FIG. 2), functions so that the laser beams K1, K2 intersect each other, split afterwards in the direction in which the stripes 9, 10 are arrayed, with their spacing increasing as they travel, and are focused at different focal positions (F1, F2), respectively (see FIG. 2).

Normally, if the beams are transformed into collimated beams with large spots, angular deviation in the optical components of only 0.1 degrees or smaller is tolerated. However, if the beams are propagated in the form of convergent beams, more angular deviation can be tolerated. Using the first lens 4 as a convergent lens is therefore preferable in slackening the tolerance imposed during the manufacturing, alignment and angular alignment of the optical components.

In addition, using the first lens 4 as a convergent lens in this way, helps reduce the spot sizes of the propagating laser beams, which enables downsizing of optical components used.

As shown in FIG. 1(A), the first lens 4 is held by a first lens holding member 13. Preferably, the first lens 4 is aligned such that the optical axes of the first laser beam K1 emitted from the first stripe 9 and the second laser beam K2 emitted from the second stripe 10 are symmetric with respect to a center axis of the first lens 4. The configuration allows both of the first laser beam K1 and the second laser beam K2 to propagate through the first lens 4 in its central region of small aberration, leading to less perturbations added to wave fronts of the laser beams and thereby increasing the coupling efficiency to the optical fiber 8. Consequently, the semiconductor laser module M1 with increased optical output can be provided. Note that the first lens 4 may preferably be an aspheric lens in order to obviate an adverse effect of spherical aberrations and thereby to attain a higher coupling efficiency.

The prism 5 is disposed between the first lens 4 and the birefringence element 7, in order to correct the optical paths of the first laser beam K1 and the second laser beam K2 incident thereon such that the two beams exit the prism along their respective optical axes parallel to each other. The prism 5 may be formed of optical glass such as BK7 (borosilicate crown glass). Since the optical axes of the first and second laser beams K1, K2 traveling in non-parallel to each other away from the first lens 4 are made parallel by refraction of the prism 5, it becomes easy not only to manufacture the birefringence element 7 disposed downstream of the prism 5 but also to downsize the birefringence element 7 and thereby to downsize the semiconductor laser module M1.

Figure 3:
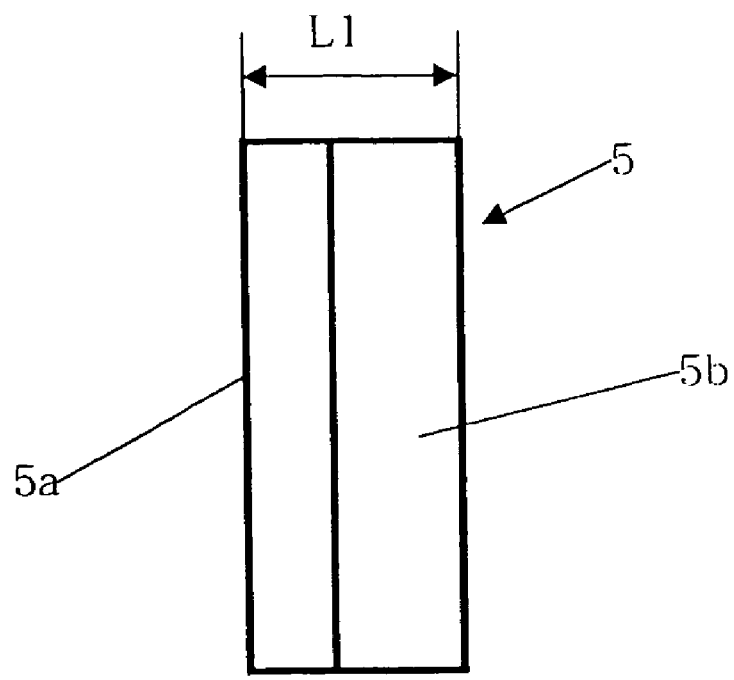
FIG. 3(A) is a side view showing a shape of a prism.
FIG. 3(B) is a plan view thereof.
Figure 3:
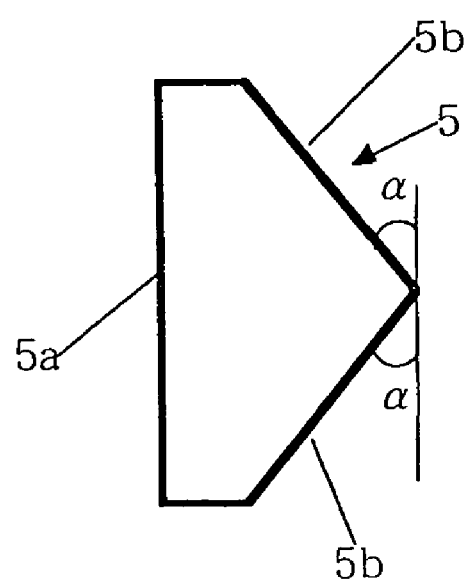

FIG. 3(A) is a side view showing a shape of the prism 5, FIG. 3(B) is a plan view thereof As shown in FIG. 3, the prism 5 includes a flat incident surface 5a and exit surfaces 5b inclined at a predetermined angle α. The prism 5 may be about 1.0 mm in total length L1 and the angle α thereof may be 3.2E0.1 degrees for the case of the prism 5 being made of BK7, with the spacing between the stripes of the semiconductor laser device being 40 μm and the focal length of the first lens 4 being chosen to be 0.7 mm.

The polarization direction transforming part 6 includes an optical isolator part 60 allowing the first and second laser beams to propagate in one direction only and a polarization rotating part 61 for rotating the polarization directions of the first and second laser beams such that they are orthogonally polarized each other.

The optical isolator part 60 consists of a polarization dependent optical isolator through which the polarization directions of the first and second laser beams incident on the optical isolator part 60 are rotated by [45G (2m−1)] degrees in identical azimuthal directions, where m is an integer. In the embodiment illustrated in FIG. 2, the optical isolator part 60 is of a single type of m=1, in which a Faraday rotator 66 is placed between a pair of polarizers 65 and in which the polarization direction of the output beams are rotated by 45 degrees with respect to the input beams.

The polarization rotating part 61 consists of a first rotating part 61a for rotating the polarization directions of the first laser beam K1 and the second laser beam K2 by 45 degrees in identical azimuthal directions, and a second rotating part 61b for rotating the polarization direction of only one of the first laser beam and the second laser beam (in the embodiment of FIG. 2, the second laser beam K2) by 90 degrees. A Faraday rotator or the like is used as the first rotating part 61a and a half wave plate or the like is used as the second rotating part 61b.

The optical isolator part 60 and the first rotating part 61a may be fixed to a single holder 60a.

Preferably, the optical isolator part 60 and the first rotating part 61a are designed such that they rotate the polarization directions of the laser beams K1, K2 in contrary azimuthal directions to each other. As will be described later, the present embodiment utilizes a polarization-synthesizing module 59 with the prism 5, the half wave plate 61b and the birefringence element 7 fixedly integrated into a single holder. With the optical isolator part 60 and the first rotating part 61a being designed to rotate the polarization directions of the laser beams K1, K2 in contrary azimuthal directions to each other, the laser beams K1, K2 at the exit of the first rotating part 61a can be each polarized in the same direction as in the case where the optical isolator part 60 and the first rotating part 61a are absent. Therefore, the polarization-synthesizing module 59 of an identical design can be used both in the semiconductor laser module with the built-in isolator according to the present invention and in the semiconductor laser module without the built-in isolator, which is advantageous in reducing the parts cost.

In the present embodiment, the prism 5 is disposed between the first rotating part 61a and the second rotating part 61b.

The birefringence element 7 includes a first input port 7a on which the first laser beam K1 is incident, a second input port 7b on which the second laser beam K2 is incident, and an output port 7c from which the first laser beam K1 incident on the first input port 7a and the second laser beam K2 incident on the second input port 7b are multiplexed and emitted. For example, the birefringence element 7 allows the first laser beam K1 to travel as an ordinary ray to the output port 7c and the second laser beam K2 as an extraordinary ray to the output port 7c. Preferably, the birefringence element 7 is made of $TiO_2$ (rutile) for example, due to its birefringence being sufficient to separate the laser beams to a large extent.

The present embodiment utilizes a polarization-synthesizing module 59, in which the prism 5, the half wave plate 61b and the birefringence element 7 are fixedly integrated to a single holder member 14. FIG. 4(A) is a cross sectional view of the polarization-synthesizing module 59 taken along the line A—A in FIG. 4(B), FIG. 4(B) is a side sectional view thereof, FIG. 4(C) is a front view thereof, and FIG. 4(D) is a perspective view illustrated with a second supporting member 19b. The holder member 14 of the polarization-synthesizing member 59 is made of a material suitable for YAG laser welding (SUS403 or 304, for example), and the entire shape thereof is formed substantially into a cylinder, as shown in FIG. 4. The holder member 14 has an accommodating portion 14a formed inside thereof, for fixedly accommodating the prism 5, the half wave plate 61b and the birefringence element 7. The top and bottom portions of the holder member 14 are formed flat.

As shown in FIG. 4(D), the polarization-synthesizing module 59 is placed between two upright walls of a second supporting member 19b having substantially an U-shaped cross section, positioned there in Y, Z, θ(azimuth around Z-axis), and Ψ(azimuth around X-axis) directions, and positioned as well, by being co-moved with the second supporting member 19b, in X and φ (azimuth around Y-axis) directions. Thereafter, it is fixed by YAG laser-welding to a second substrate 18 (which will be referred to later) through the second supporting member 19b.

The configuration allows easier alignment of the prism 5 and the birefringence element 7 such that the first laser beam K1 incident on the first input port 7a of the birefringence element 7 and the second laser beam K2 incident on the second input port 7b are both emitted from the output port 7c.

Thus, if these optical parts are integrated into a single body using the holder member 14, it is possible to adjust a degree of overlapping of the laser beams K1, K2 at the output port 7c of the birefringence element 7 simply by moving the holder member 14 through the second support member 19b.

In the embodiment, the polarization-synthesizing module 59 in which the prism 5, the half wave plate (second rotating part) 61b and the birefringence element 7 are fixedly integrated is used. However, the polarization-synthesizing module in which the optical isolator part 60 and the first rotating part 61a are further fixed to the same holder member 14 may be used.

As shown in FIG. 2, the optical fiber 8 receives the laser beams emerging from the output port 7c of the birefringence element 7 and transmits them to outside of the package 1.

Between the birefringence element 7 and the optical fiber 8 is disposed a second lens 16 for coupling the laser beams emerging from the output port 7c of the birefringence element 7 to the optical fiber 8. Note that in the embodiment, the first lens 4 is positioned such that the first laser beam K1 and the second laser beam K2 have focused points (F1, F2) between the first lens 4 and the second lens 16. The configuration allows spot sizes of the laser beams between the first lens 4 and the second lens 16 to be smaller and prevents overlapping of the beams, reducing the propagation length L (see FIG. 2) necessary for the separation D' between the first laser beam K1 and the second laser beam K2 to be large enough to permit the half wave plate 61b to be inserted only on the optical path of the second laser beam K2. Hence, a length of the semiconductor laser module M1 along the optical axis can be smaller, and consequently, it is possible to provide a highly reliable semiconductor laser module with superior stability over time of optical coupling between the semiconductor laser device 2 and the optical fiber 8 in a high temperature environment.

In addition, since the spot sizes of the laser beams between the first lens 4 and the second lens 16 can be smaller, it is also possible to downside the optical components used there.

As shown in FIG. 1, a chip carrier 11 to which the semiconductor laser device 2 is fixed and a photodiode carrier 12 to which a photodiode 3 is fixed, are soldered to a first substrate 17 having an L-shaped cross section. The first substrate 17 is preferably formed of copper-tungsten alloy etc. in order to assure superior dissipation of the heat generated by the semiconductor laser device 2.

A first lens holding member 13 fixedly holding the first lens 4 and the polarization-synthesizing module 59 in which the prism 5, the half wave plate 61b and the birefringence element 7 are fixed to the holder member 14, are fixed by YAG laser-welding to a second substrate 18 made of stainless steel blazed in advance onto the first substrate 17, respectively through a first supporting member 19a and a second supporting member 19b.

Beneath the first substrate is disposed a cooler 20 comprising peltier elements. The temperature rise by the heat generation of the semiconductor laser device 2 is detected by a thermistor 20a disposed on the chip carrier 11, while the cooler 20 is controlled such that the temperature detected by the thermistor 20a is kept at a predetermined value. In this way, the intensity of the laser emission from the semiconductor laser device 2 is increased and stabilized.

Inside a flange 1a formed on a side of the package 1, a window 1b for allowing the beams that have passed through the birefringence element 7 to be incident on is disposed inside the flange 1a. In addition, the second lens 16 for converging the laser beams is fixed to an end of the flange 1a. The second lens 16 is held by a second lens holding member 21 which is YAG laser-welded to the end of the flange 1a, and a ferrule 23 holding the optical fiber 8 is YAG laser-welded to an end of the second lens holding member 21 through a metal slide ring 22.

Next, the operation of the semiconductor laser module M1 according to the first embodiment of the present invention will be explained below.

As shown in FIG. 2, the first laser beam K1 and the second laser beam K2, being respectively emitted from the front end faces 2a of the first stripe 9 and the second stripe 10 of the semiconductor laser device 2, travel through the first lens 4, intersect each other, and thereafter are separated until their mutual separation is sufficient, while they travel through the optical isolator part 60 and the first rotating part 61a of the polarization rotating part 61. While traveling through the optical isolator part 60, the first and second laser beams K1, K2 experience a rotation of their polarization directions by 45 degrees, and in addition, they experience another rotation of their polarization directions by 45 degrees while traveling through the first rotating part 61a of the polarization rotating part 61. Thus, the rotation of their polarization directions each amounts to 90 degrees.

Then, the first and second laser beams K1, K2 emerging from the first rotating part 61a of the polarization rotating part 61 enter the prism 5. On entering the prism 5, the separation (D) between the first laser beam K1 and the second laser beam K2 is about 460 μm. The first laser beam K1 and the second laser beam K2 are made parallel to each other through the prism 5 and emitted in that state (with their separation being enlarged to about 500 μm). Then, the first laser beam K1 enters the first input port 7a of the birefringence element 7 while the second laser beam K2 enters the second rotating part 61b of the polarization rotating part 61, where it experiences rotation of its polarization direction by 90 degrees, and enters the second input port 7b of the birefringence element 7.

The first laser beam K1 entering the first input port 7a and the second laser beam K2 entering the second input port 7b are multiplexed along the birefringence element 7 and emitted from the output port 7c.

The laser beams emerging from the birefringence element 7 are then converged by the second lens 16 onto the end face of the optical fiber 8, propagate in the fiber and are let travel to outside.

In the semiconductor laser module MI according to the first embodiment of the present invention, since it has the first rotating part 61a and the second rotating part 61b in the polarization rotating part 61 disposed downstream on the optical isolator part 61, the first laser beam K1 and the second laser beam K2 are made to respectively enter the first input port 7a and the second input port 7b of the birefringence element 7 with predetermined states of polarizations, despite the 45 degrees rotation of the polarization directions experienced by the laser beams during their propagation through the single type polarization dependent optical isolator utilized as the optical isolator part 60. The configuration allows the beams to propagate through the birefringence element 7 to the output port 7c without each splitting into an ordinary ray and an extraordinary ray on entering the birefringence element 7, and therefore it is free from decrease of optical power reaching the output port 7c, enabling the semiconductor laser module of high output power to be realized.

Next, the manufacturing method of the semiconductor laser module M1 according to the first embodiment of the present invention is described.

First, a chip carrier 11 to which a semiconductor laser device 2 is fixed and a photodiode carrier 12 to which a photodiode 3 is fixed, are soldered to a first substrate 17.

Then, a first lens 4 is aligned on a second substrate 18 and fixed thereto. In aligning the first lens 4, both of the first laser beam K1 and the second laser beam K2 are emitted from the first stripe 9 and the second stripe 10 of the semiconductor laser device 2 by supplying an electric current to the semiconductor laser device 2, and the direction of their emission is set as a fiducial direction. Thereafter, the first lens is inserted and positioned in X, Y, and Z directions.

FIG. 27 is an explanatory diagram showing an alignment process of the first lens 4. As shown in FIG. 27(A), the first lens 4 is positioned in the X-axis direction such that the angle θ1 made between the fiducial direction (i.e. a central axis C2) set in the above-described way and the first laser beam K1 is equal to the angle θ2 made between the central axis C2 and the second laser beam K2. In the Y-axis direction, it is positioned such that the first laser beam K1 and the second laser beam K2 travel on the central axis of the first lens 4, as shown in FIG. 27(B). And in Z-axis direction, it is positioned such that each of the laser beams emerging from the first lens 4 has a minimal spot diameter at a predetermined position between the first lens 4 and the second lens 16. The first lens holding member 13 holding the first lens 4 which has been aligned in the above-described way, is then fixed to the second substrate 18 by YAG laser-welding through a first supporting member 19a.

Then, an optical isolator part 60 and a first rotating part 61a are fixed on the second substrate 18. The optical isolator part 60 are rotatingly adjusted around the fiducial direction (the central axis C2) such that the intensity of the laser beams emerging therefrom is maximal, thereafter it is fixed to the second substrate 18 by YAG laser-welding, etc.

Thereafter, a polarization-synthesizing module 59 in which a prism 5, a half wave plate and a birefringence element 7 are integrated, is aligned on the second substrate 18 and fixed thereto. In aligning the polarization-synthesizing module 59, a dummy fiber for alignment (i.e. a fiber with lens, unillustrated) is positioned so as to receive the synthesized beam emerging from the output port 7c of the birefringence element 7. Then, the holder member 14 is positioned in each of X, Y, Z, θ (azimuth around Z-axis), Φ (azimuth around Y-axis), and Ψ (azimuth around X-axis) directions, such that the optical power coupled to the dummy fiber is maximized (see FIG. 4). In doing so, as shown in FIG. 4(D), the holder member 14 is placed between two upright walls of a second supporting member 19b having substantially an U-shape in cross section, and positioned in each of Y, Z, θ, and Ψ directions and positioned as well, being co-moved with the second supporting member 19b, in X and Φ directions.

The alignment of the polarization-synthesizing module 59 having been finished in this way, the second supporting member 19b is then YAG laser-welded to the second substrate 18 as shown in FIG. 4(D), followed by the holder member 14 being YAG laser-welded to the upright walls of the second supporting member 19b. Thus, the holder member 14 is fixed to the second substrate 18.

Then, the first substrate 17 is positioned on the cooler 20 which in advance has been fixed on a bottom plate of a package 1, such that the laser beams emerging from the output port 7c of the birefringence element 7 travel in the middle of the flange 1a. Thereafter, the first substrate 17 is fixed there by soldering.

Then, the semiconductor laser device 2 and the photodiode 3 for monitoring are electrically connected to leads (unillustrated) of the package 1 through gold wires (unillustrated).

A lid 1c is then placed on an upper end of the package 1 in an inert gas (such as $N_2$ or Xe) atmosphere, in which the package is hermetically sealed by resistivity-welding the peripheral edge of the lid.

Thereafter, a second lens 16 is positioned in X-Y plane and in Z direction on the flange 1a of the package 1, and fixed there. In this step, the second lens holding member 21 is moved on an edge surface of the flange I a while being inserted into a slide ring 1*d*, until the laser beam emerging from the second lens 16 is parallel to the central axis of the flange 1*a* of the package 1 (which is in parallel to Z-axis). The slide ring 1*d* is then YAG laser-welded to the edge of the flange 1*a*. Thereafter, the second lens holding member 21 is moved along Z-axis direction, while monitoring the divergence angle of the beam emerging from the second lens 16, until the divergence angle substantially matches with a numerical aperture (NA) of the optical fiber 8. The second lens holding member 21 and the slide ring 1*d* are then YAG laser-welded together.

In the final step, an optical fiber 8 is aligned and fixed. In this step, a ferrule 23 is held, while being inserted into a slide ring 22, and is positioned in a plane orthogonal to the optical axis of the optical fiber 8 (i.e. in X-Y plane) and in the direction along the optical axis of the optical fiber 8 (i.e. in Z direction), such that the intensity of the beam coupled to the optical fiber 8 is maximized.

The alignment of the optical fiber 8 having been finished in this way, the ferrule 23 is then fixed to the slide ring 22 by YAG laser-welding at its interior. Thereafter, the slide ring 22 and the second lens holding member 21 are fixed together by YAG laser-welding at their boundary.

Thus, the assembly of the semiconductor laser module M1 is finished.

Figure 5:
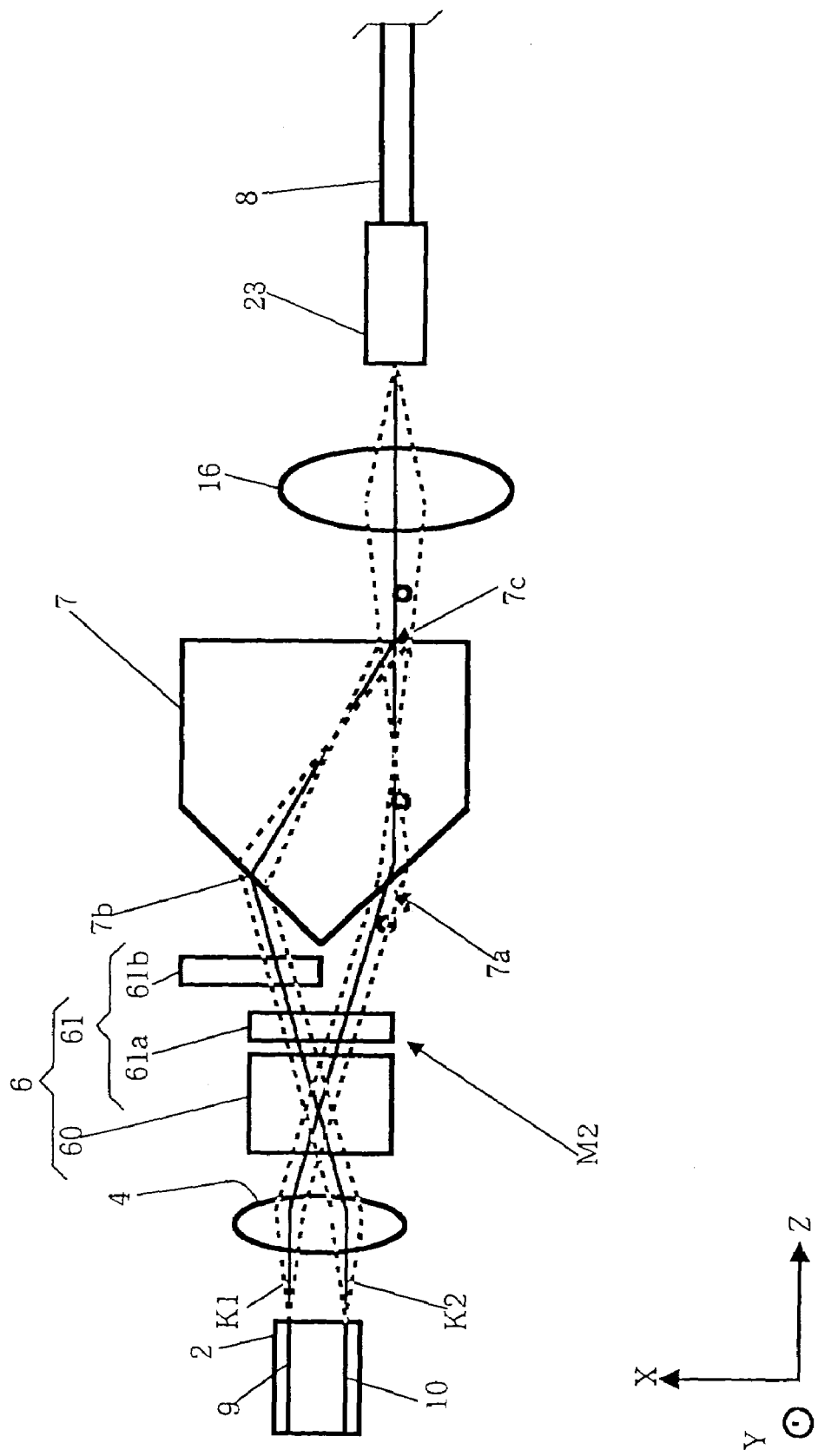
FIG. 5 is an explanatory diagram schematically showing a configuration of a modified example of the semiconductor laser module in accordance with the embodiment of the present invention.

Note that, the semiconductor laser module according to the present invention is not limited to the one configured as above-described. For example, it may be a semiconductor laser module M2 as shown in FIG. 5, in which the first laser beam K1 and the second laser beam K2 are incident in non-parallel to each other on the birefringence element 7, the input end face of which being formed in wedge-shape such that the first laser beam K1 travels as an ordinary ray along an axial direction of the optical fiber 8 and that the second laser beam K2 travels as an extraordinary ray and is emitted in parallel with the optical axis of the optical fiber from the output port 7*c* of the birefringence element 7 along with the first laser beam K1.

Figure 6:
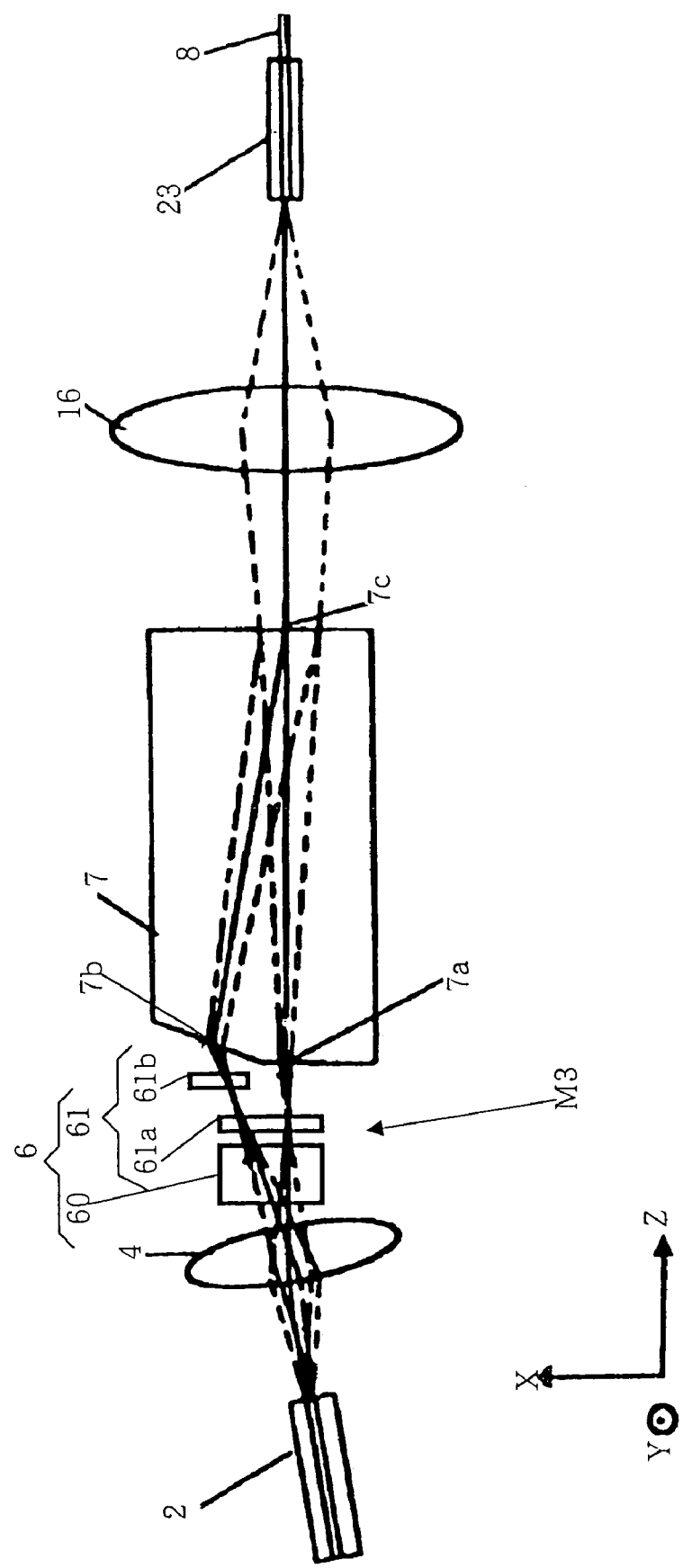
FIG. 6 is an explanatory diagram schematically showing a configuration of a modified example of the semiconductor laser module in accordance with the embodiment of the present invention.

It may also be a semiconductor laser module M3 as shown in FIG. 6, in which the semiconductor laser device 2 and the first lens 4 are disposed with tilts at a predetermined angle to the axial direction of the optical fiber 8 such that the laser beam K1 emerged from the first lens 4 travels along the axial direction of the optical fiber 8, and in which the second input port 7*b* of the birefringence element 7 is inclined with respect to the first input port 7*a*.

Figure 7:
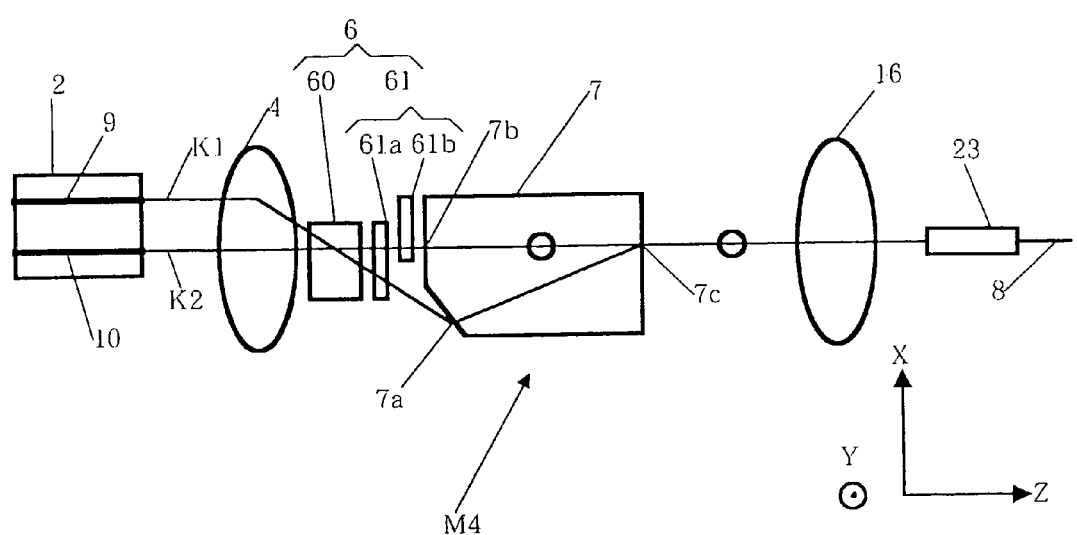
FIG. 7 is an explanatory diagram schematically showing a configuration of a modified example of the semiconductor laser module in accordance with the embodiment of the present invention.

Further, it may be a semiconductor laser module M4 as shown in FIG. 7, in which the first lens 4 is positioned such that the second laser beam K2 travels almost on the central axis of the first lens, and in which the first input port 7*a* is inclined with respect to the second input port 7*b* such that the second laser beam K2 travels in parallel with the axial direction of the optical fiber 8 and that the first laser beam K1 is emitted from the output port 7*c* along with the second laser beam K2.

The above described semiconductor laser modules M2 to M4, since there is no prism 5 disposed, can be simpler in structure and shorter in length along the optical axis, leading to a reduced susceptibility to a warpage of the package that could affect the optical output characteristics in a high temperature environment.

Figure 8:
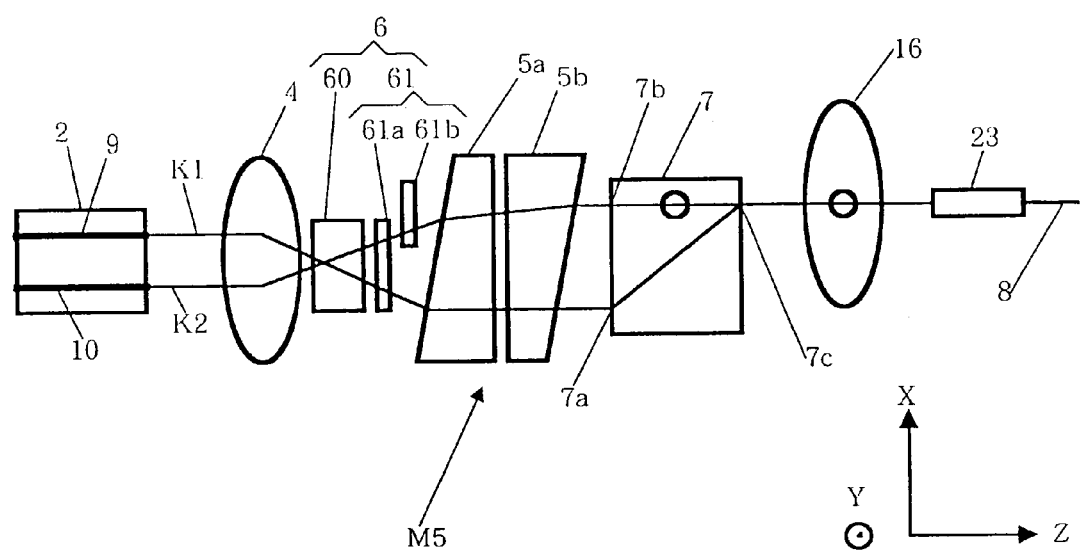
FIG. 8 is an explanatory diagram schematically showing a configuration of a modified example of the semiconductor laser module in accordance with the embodiment of the present invention.

Still further, the semiconductor laser module according to the present invention may be a semiconductor laser module M5 as shown in FIG. 8, in which a plurality (i.e. two, in FIG. 8) of wedge-shaped prisms 5*a*, 5*b* are disposed along the optical axis so that laser beams K1, K2 emerging from the first lens 4 are made parallel to each other. In this embodiment, it is easy to make the two laser beams K1, K2 precisely parallel to each other.

Figure 9A:
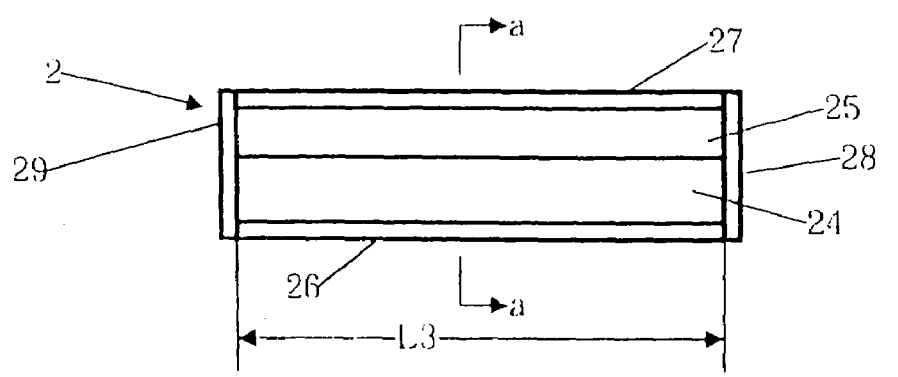

The semiconductor laser device 2 used in the semiconductor laser module according to the present invention will be explained hereinbelow. FIGS. 9(A), (B) are explanatory diagrams showing a structure of the semiconductor laser device 2 used in the semiconductor laser module of the present invention, FIG. 10 is an explanatory diagram showing another example of the semiconductor laser device 2. Note that FIG. 9(B) is a cross sectional diagram taken along the line a—a in FIG. 9(A).

As shown in FIG. 9(A), the semiconductor laser device 2 has a lamination structure of predetermined semiconductor materials formed on a substrate 24 by a known epitaxial growth technique such as the metal organic chemical vapor deposition, liquid phase epitaxy, molecular beam epitaxy, or gas source molecular beam epitaxy. A lower electrode 26 is formed on an undersurface of the substrate 24 and an upper electrode 27 is formed on the lamination structure 25, and thereafter, the lamination structure is cleaved to form a cavity of a predetermined length L3. Then, a low reflection layer 28 (with reflectance less than or equal to 5%, for instance) is formed on its one cleaved facet (front end face 2*a*), and a high reflection layer 29 (with reflectance greater than or equal to 90%, for instance) is formed on the other cleaved facet (rear end face 2*b*).

Figure 9B:
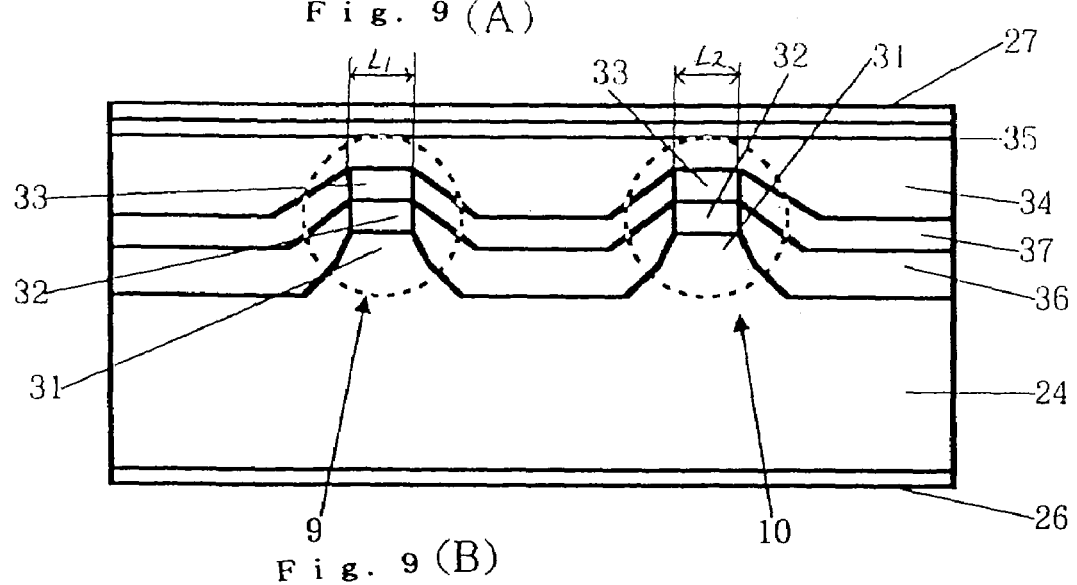
FIG. 9(B) is a cross sectional diagram taken along the line a—a in FIG. 9(A)
Figure 10:
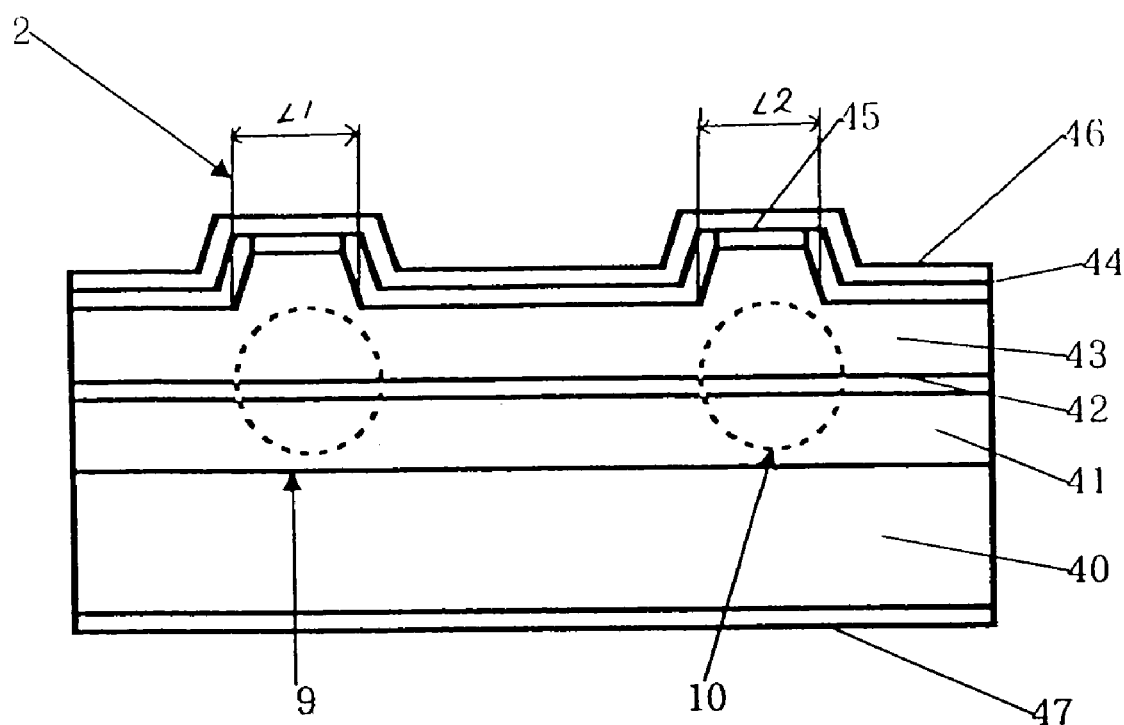
FIG. 10 is an explanatory diagram showing another example of the semiconductor laser device.

As shown in FIG. 9(B), the lamination structure 25 on the substrate 24 is, for instance, of a BH structure (buried heterostructure) including for instance an InP substrate 24 and stacked layers of e.g. an n-InP clad layer 31, an active layer 32 consisting of e.g. a GRIN-SCH-MQW (Graded Index Separate Confinement Heterostructure Multi Quantum Well) composed of multilayers of GaInAsP, and e.g. a p-InP clad layer 33, which are sequentially stacked in this order. The lamination structure 25 further includes an upper buried layer 34 composed of e.g. p-InP and a cap layer 35 composed of e.g. p-GaInAsP, which are stacked on the p-InP clad layer 33. In addition, the upper electrode 27 is formed on the cap layer 35 and the lower electrode 26 is formed on the undersurface of the substrate 24.

Then, the lower n-InP clad layer 31, the active layer 32 and the p-InP clad layer 33 are formed into two ridges of stripes arranged in parallel with each other with a spacing of 40 to 60 µm interposed. A p-InP blocking layer 36 and an n-InP blocking layer 37 stacked in this order on the side faces of the ridges define a current confinement region to the active layer 32.

For the purpose of increasing optical output, the active layer 32 preferably involves compressive strain quantum wells with a lattice mismatch of well layers with respect to the substrate 24 within the range between 0.5% and 1.5%, formed in a multi quantum well structure of well number of five or so. Further, a larger value in lattice mismatch in the well layers can be tolerated if a strain compensation structure in which barrier layers have tensile strains opposite to the strains of well layers are adopted in the strained quantum well structure in order for the lattice matching to be equivalently realized.

According to the present embodiment, the light-emitting portions, comprising the lower n-InP clad layer 31, the GRIN-SCH-MQW active layer 32 and the p-InP clad layer 33, are formed as stripes extending in a direction vertical to the sheet surface in FIG. 9(B). These portions are called stripes 9 and 10, respectively.

As shown in FIG. 1(B), the semiconductor laser device 2 is bonded to the heat sink 58 at its upper electrode 27 by use of AuSn solder, etc. Thus, the two stripes are capable of simultaneously oscillating and emitting two laser beams through the low reflection layer 28 when being externally supplied with a current through the upper electrode 27 (i.e. p-side in the present embodiment) and the lower electrode 26 (i.e. n-side in the present embodiment).

Here, if the two stripes have completely the same characteristics, then a threshold current of the semiconductor laser device 2 in the present embodiment is twice the threshold current of one stripe, and the total optical output is twice the optical output from one stripe. Namely, the semiconductor laser device 2 as a whole, outputs twice as much optical power at approximately twice as much current as one stripe, with the slope efficiency being unchanged from the case where the semiconductor laser device has only a single stripe.

Note that the semiconductor laser device 2 described in the above embodiment has been exemplified as having the InP-based BH structure. However, the semiconductor laser device 2 may be of a GaAs-based ridge waveguide type as shown in FIG. 10. In FIG. 10, the semiconductor laser device 2 has a lower n-clad layer 41, an active layer 42, an upper p-clad layer 43, an insulation layer 44, and a p-GaAs layer 45 laminated on a substrate 40 composed of n-GaAs, and two ridges are formed therein. An upper electrode (p-side electrode) 46 is formed on the insulation layer 44 and p-GaAs layer 45, and a lower electrode (n-side electrode) 47 is formed on an undersurface of the substrate 40.

The ridges are formed as stripes extending in a direction vertical to the sheet surface in FIG. 10, and it is the portions of the active layers 42 just beneath the ridges that emit light. These light-emitting portions are called stripes 9 and 10, respectively. It is needless to say that the ridge LD can be realized in InP-based material.

Figure 11:
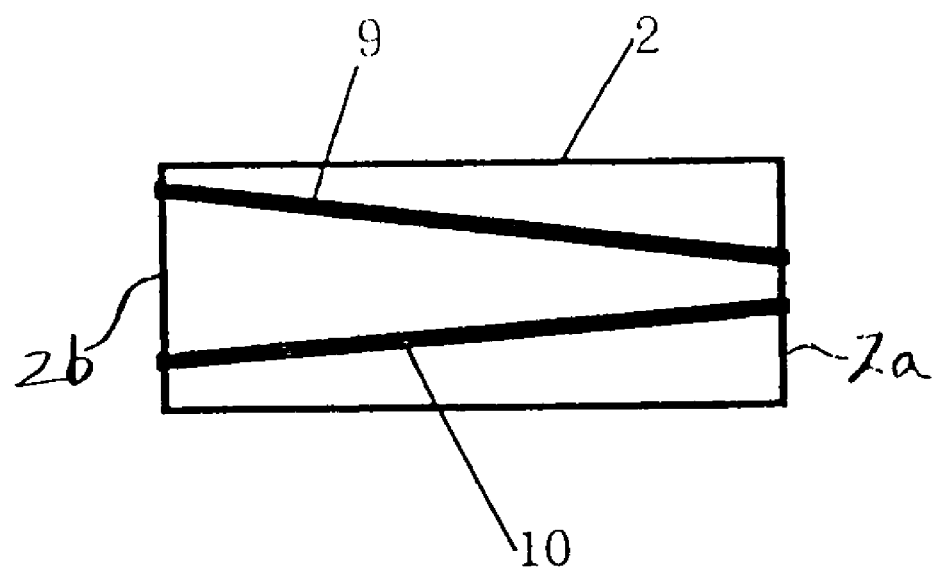
FIG. 11 is an explanatory diagram showing a modified example of the semiconductor laser device used in the embodiment of the present invention.

In the above-described semiconductor laser device 2, the first stripe 9 and the second stripe 10 are extending in parallel to each other in the longitudinal direction. However, the stripes are not necessarily arranged as such, but may be slanted, as shown in FIG. 11. In FIG. 11, the laser beams are emitted rightward, and the space between the stripes 9 and 10 becomes narrower as it gets closer to the right side edge. Such an arrangement of the stripes allows the two laser beams emitted from the two stripes 9, 10 to intersect at a position closer to the semiconductor laser device 2, and help reduce the length (L) necessary for the first laser beam K1 and the second laser beam K2, having passed through the first lens 4, to propagate until their separation is large enough to permit a half wave plate 61b to be inserted only on the optical path of the second laser beam K2 (i.e. until D' in FIG. 2 is sufficiently large.). Therefore, it is possible to provide a semiconductor laser module M1 of a reduced length along its optical axis.

Note that the propagation length L can be reduced likewise when the stripes are slanted contrarily to those in FIG. 11, namely, in such a manner that the space between the stripes 9 and 10 becomes wider as it gets closer to the right side edge.

SECOND EMBODIMENT

Figure 12A:
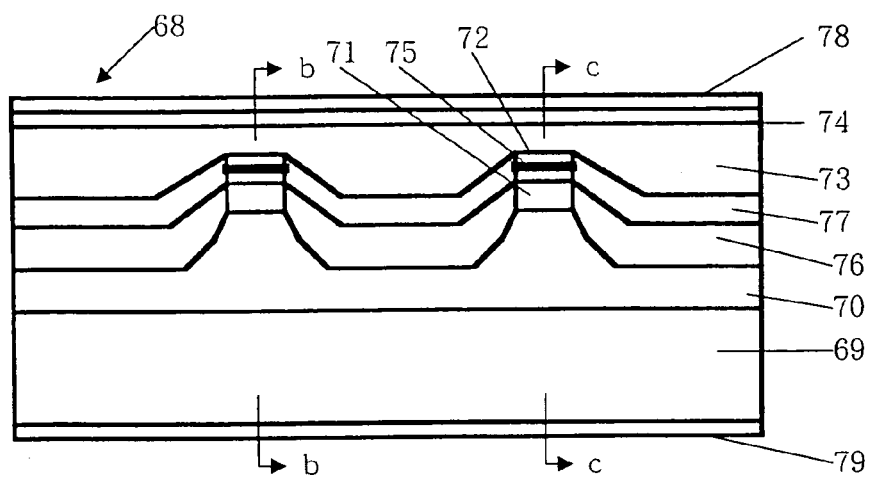
FIGS. 12(A) to (C) are explanatory diagrams showing a structure of a semiconductor laser device used in a semiconductor laser module in accordance with a second embodiment of the present invention.
Figure 12B:
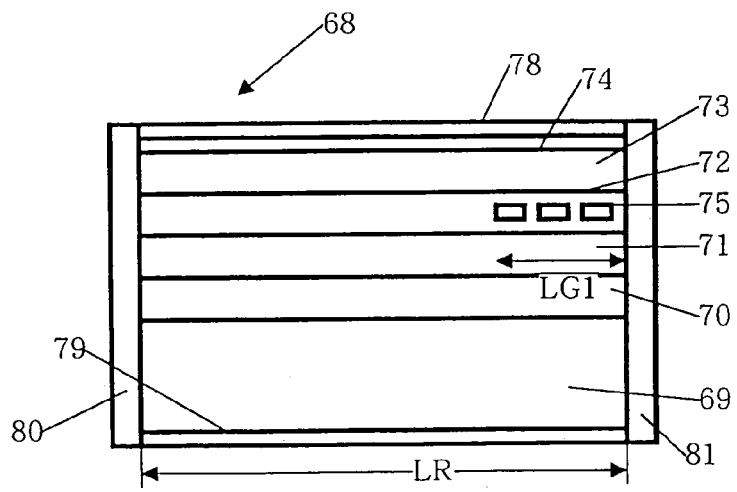
Figure 12C:
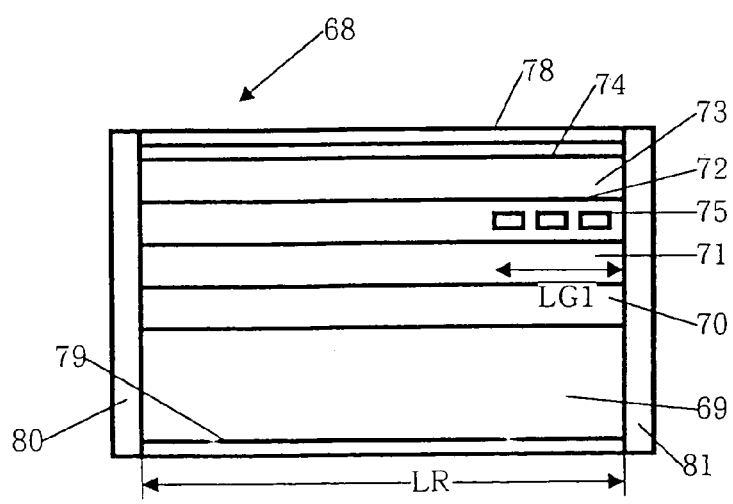

FIGS. 12(A) to (C) shows a semiconductor laser device 68 used in the semiconductor laser module in accordance with a second embodiment of the present invention, with a different structure from that of the semiconductor laser device 2 shown in FIG. 9. FIGS. 12(B) and (C) are cross sectional diagrams taken along the lines b—b and c—c, respectively, in FIG. 12(A).

In the second embodiment, the wavelength of the laser beams K1, K2 emitted from the stripes are stabilized by forming a diffraction grating 75 that selects a wavelength of light around a predetermined center wavelength $\lambda_0$ within each of the stripes of the semiconductor laser device 68.

As shown in FIG. 12, the semiconductor laser device 68 of the second embodiment has a lamination structure in which an n-InP layer 70 serving both as a buffer layer and as a lower clad layer, a GRIN-SCH-MQW active layer 71, a p-InP clad layer 72, a p-InP buried layer 73, and a GaInAsP cap layer 74 are sequentially stacked on a (100) surface of an InP substrate 69.

Within each of the stripes 9 and 10, a diffraction grating 75 is formed by periodically arranging 20 nm-thick p-InGaAs layers with a predetermined pitch. The diffraction grating 75 is formed over a predetermined length LG1 extending from a second reflection layer 81 having a reflectance of as low as 2% or less, preferably 1% or less, still preferably 0.2% or less, toward a first reflection layer 80 having a reflectance of as high as 80% or higher, but not formed over the portion other than the predetermined length L1. The diffraction gratings 75 are designed to select laser lights having a center wavelength $\lambda_0$ of 1300 nm to 1550 nm. In addition, the cavity length LR of the semiconductor laser device 68 is set to 800 μm or longer. The other constitution of the semiconductor laser device 68 is the same as those of the semiconductor laser device 2 (as shown in FIG. 9).

The light generated in the GRIN-SCH-MQW active layer 71 of the optical cavity formed between the first reflection layer 80 and the second reflection layer 81 is amplified while being repeatedly reflected by the first reflection layer 80 and the second reflection layer 81, until it is emitted as a laser beam through the second reflection layer 81.

It is generally known that mode spacings $\Delta\lambda$ of the longitudinal modes generated by a cavity of a semiconductor laser device is expressed as:

$$\Delta\lambda = \lambda_0^2/(2nL_R)$$

where n is an equivalent refractive index.

If the oscillation wavelength $\lambda_0$ is set to 1480 nm and if the equivalent refractive index is set to 3.5, the longitudinal mode spacing $\Delta\lambda$ is calculated to be approximately 0.39 nm for the case of the cavity length of 800 μm, and approximately 0.1 nm for the cavity length of 3200 μm. That is, the larger the cavity length, the smaller the longitudinal mode spacing $\Delta\lambda$ becomes, which implies generally that the mode selection condition for realizing the single longitudinal mode oscillation becomes strict as the cavity length is increased.

Figure 13:
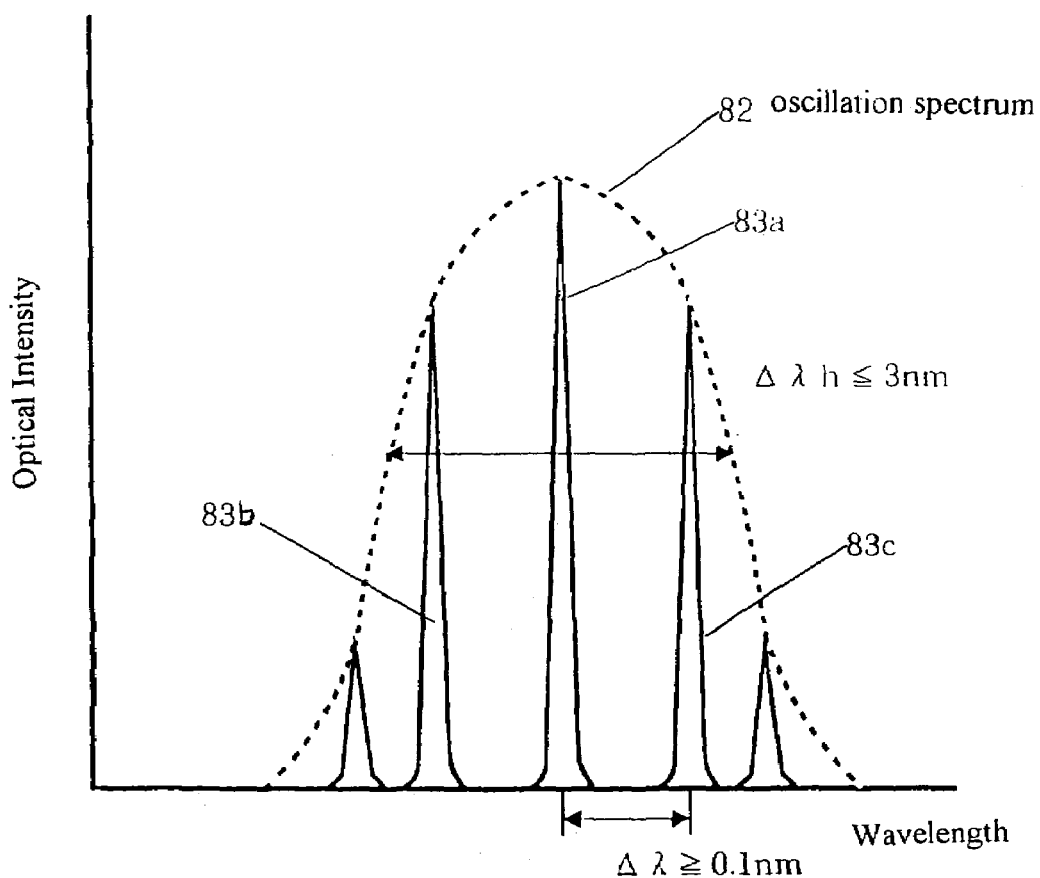
FIG. 13 is a graph showing a relation between an oscillation spectrum and oscillation longitudinal modes of the semiconductor laser device used in the semiconductor laser module in accordance with the second embodiment of the present invention.

On the other hand, the diffraction gratings 75 formed within the stripes of the semiconductor laser device of the present embodiment select longitudinal modes in accordance with their Bragg wavelengths. The wavelength selection by the diffraction gratings 75 is characterized by the oscillation spectrum 82 as shown in FIG. 13.

In the present embodiment, the semiconductor laser device with the diffraction gratings 75 is designed to oscillate in a plurality of longitudinal modes within the selected wavelength range, represented by a full width at half maximum $\Delta\lambda_h$ of the oscillation spectrum.

Note that the DFB semiconductor laser device or the like known in prior arts has been designed to oscillate in a single longitudinal mode, and the cavity length for that kind of lasers have not been selected to be greater than or equal to 800 μm, where a narrow longitudinal mode spacing accounts for a weak mode selectivity and consequent inability to oscillate in a single longitudinal mode. However, the semiconductor laser device 68 of the present embodiment is designed to oscillate in an increased number of longitudinal modes within the full width at half maximum $\Delta\lambda_h$ by positively adopting the cavity length $L_R$ of 800 μm or greater and simultaneously by changing the full width at half maximum $\Delta\lambda_h$ of the oscillation spectrum 82 through changing the length LG1 or a coupling coefficient of the diffraction gratings. Note that FIG. 13 exemplarily shows three longitudinal modes 83a to 83c oscillating within the full width at half maximum $\Delta\lambda_h$ of the oscillation spectrum.

The present invention, since it has an optical isolator disposed between the semiconductor laser device and the optical fiber, is in principle not able to stabilize an oscillation wavelength by using a feedback light from a fiber Bragg grating (FBG). However, since the semiconductor laser device 68 used in the semiconductor laser module according to the second embodiment has diffraction gratings 75 within the stripes, it can emit laser beams with stabilized oscillation wavelengths. In addition, it can emit laser beams of suppressed relative intensity noise (RIN) as opposed to the case where the oscillation wavelengths are stabilized by a fiber Bragg grating (FBG). The semiconductor laser module with the above features can preferably be used as a low-noise pumping light source in Raman amplifiers.

Further, in the semiconductor laser device 68, since it has a plurality of longitudinal modes oscillating within a full width at half maximum $\Delta\lambda_h$ of its oscillation spectrum, each of the longitudinal modes carries a lowered intensity of power as compared with the case of the semiconductor laser device oscillating in a single longitudinal mode and emitting the same intensity of optical output as a whole.

Figure 14:
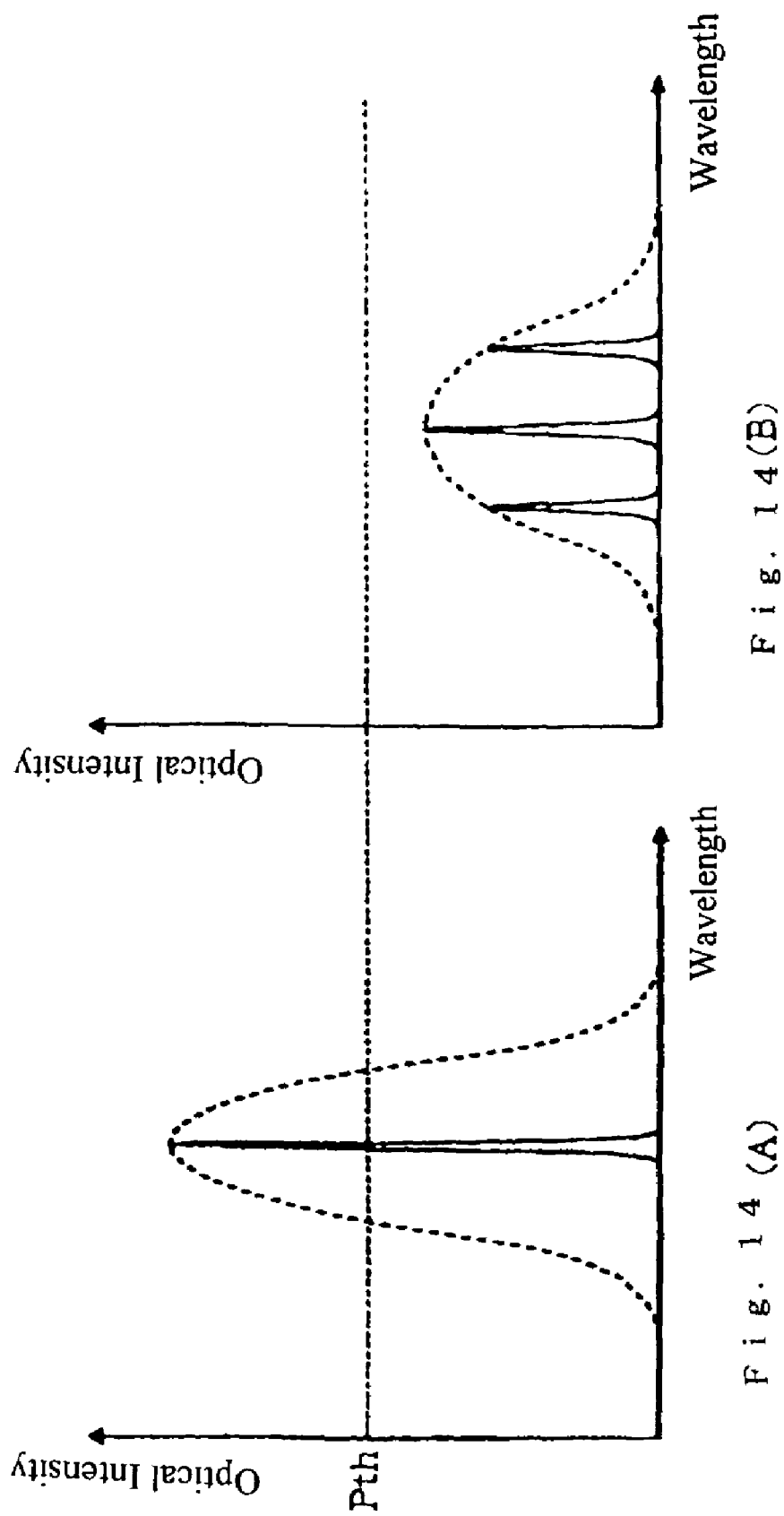
FIGS. 14(A) and (B) are diagrams showing a relation between the intensity of the oscillation longitudinal modes and the threshold of stimulated Brillouin scattering for the cases of single longitudinal mode oscillation and of multi longitudinal mode oscillation, respectively.

FIGS. 14(A) and (B) are diagrams schematically showing longitudinal mode spectra of semiconductor laser devices 68 emitting a light of the same intensity for the cases of the semiconductor laser device oscillating respectively (A) in a single longitudinal mode, and (B) in a plurality of longitudinal modes, where the broken line designated with Pth in the figure marks a threshold for stimulated Brillouin scattering (SBS) to occur (hereinafter called SBS threshold). Since the semiconductor laser device 68 of the second embodiment has a plurality of longitudinal modes oscillating within its fill width at half maximum of the oscillation spectrum, the intensity carried by each of the oscillating longitudinal mode can be suppressed to SBS threshold or lower, whereby SBS is prevented from occurring and an amplification with increased gain and reduced noise can result.

Note that, if the semiconductor laser device oscillates in a plurality of longitudinal modes within too wide a spectral width of oscillation, the laser lights may suffer an increased coupling loss at a wavelength-multiplexing coupler, and sometimes an adding of noises or fluctuations of gain due to longitudinal mode hoppings occurred within the oscillation spectrum. For this reason, the full width at half maximum $\Delta\lambda_h$ of the oscillation spectrum 82 is preferably set to 3 nm or smaller, or still preferably, 2 nm or smaller.

THIRD EMBODIMENT

Figure 15:
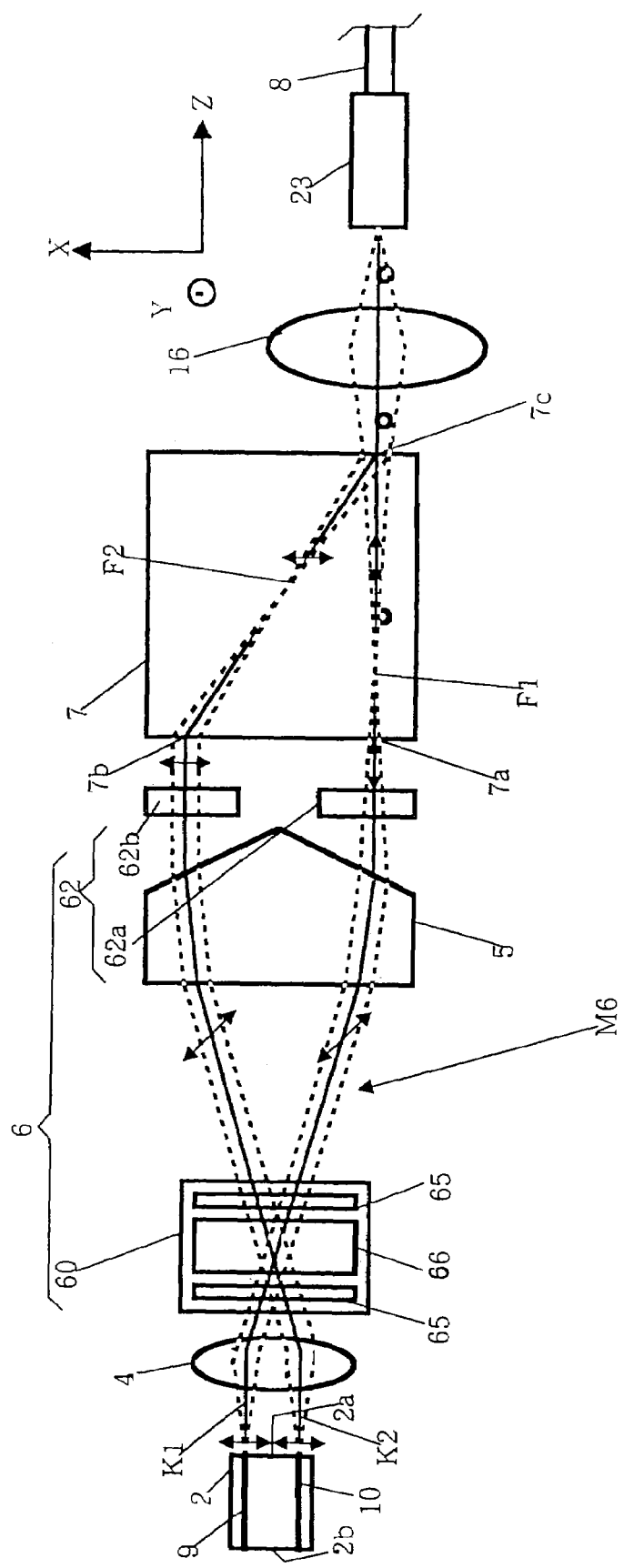
FIG. 15 is an explanatory diagram schematically showing a configuration of a semiconductor laser module in accordance with a third embodiment of the present invention.

FIG. 15 is an explanatory diagram schematically showing a configuration of a semiconductor laser module in accordance with a third embodiment of the present invention.

As shown in FIG. 15, in the semiconductor laser module M6 according to the third embodiment of the present invention, a prism 5 is disposed between an optical isolator part 60 and a polarization rotating part 62. The polarization rotating-part 62 consists of a first polarization rotator 62a disposed between the prism 5 and a first input port 7a of a birefringence element 7 and configured to rotate a polarization direction of the first laser beam K1 by 45 degrees, and a second polarization rotator 62b disposed between the prism 5 and a second input port 7b of the birefringence element 7 and configured to rotate a polarization direction of the second laser beam K2 by minus 45 degrees. A half wave plate 6 or a Faraday rotator 66 can be used as the polarization rotator 62a or 62b. The other constitutions of the semiconductor laser module are similar to those of the first embodiment.

In the semiconductor laser module M6 according to the third embodiment of the present invention, since it has the first polarization rotator 62a and the second polarization rotator 62b disposed downstream on the optical isolator part 60 and configured to rotate the polarization directions of the laser beams by 45 degrees in mutually contrary azimuthal directions, the first laser beam K1 and the second laser beam K2 are made to be incident respectively on the first input port 7a and the second input port 7b of the birefringence element 7 in the state that the polarization direction of the first laser beam K1 is rotated by 90 degrees in the aggregate and that the polarization direction of the second laser beam K2 is unchanged, despite the 45 degrees rotations of the polarization directions experienced by the two laser beams during their propagation through a single type polarization dependent isolator utilized as the optical isolator part 60. The configuration allows the two beams to propagate through the birefringence element 7 to the output port 7c without each splitting into an ordinary ray and an extraordinary ray on entering the birefringence element 7, and therefore it is free from decrease of optical power reaching the output port 7c. Thus, it is possible to provide a semiconductor laser module of a high output power.

FOURTH EMBODIMENT

Figure 16:
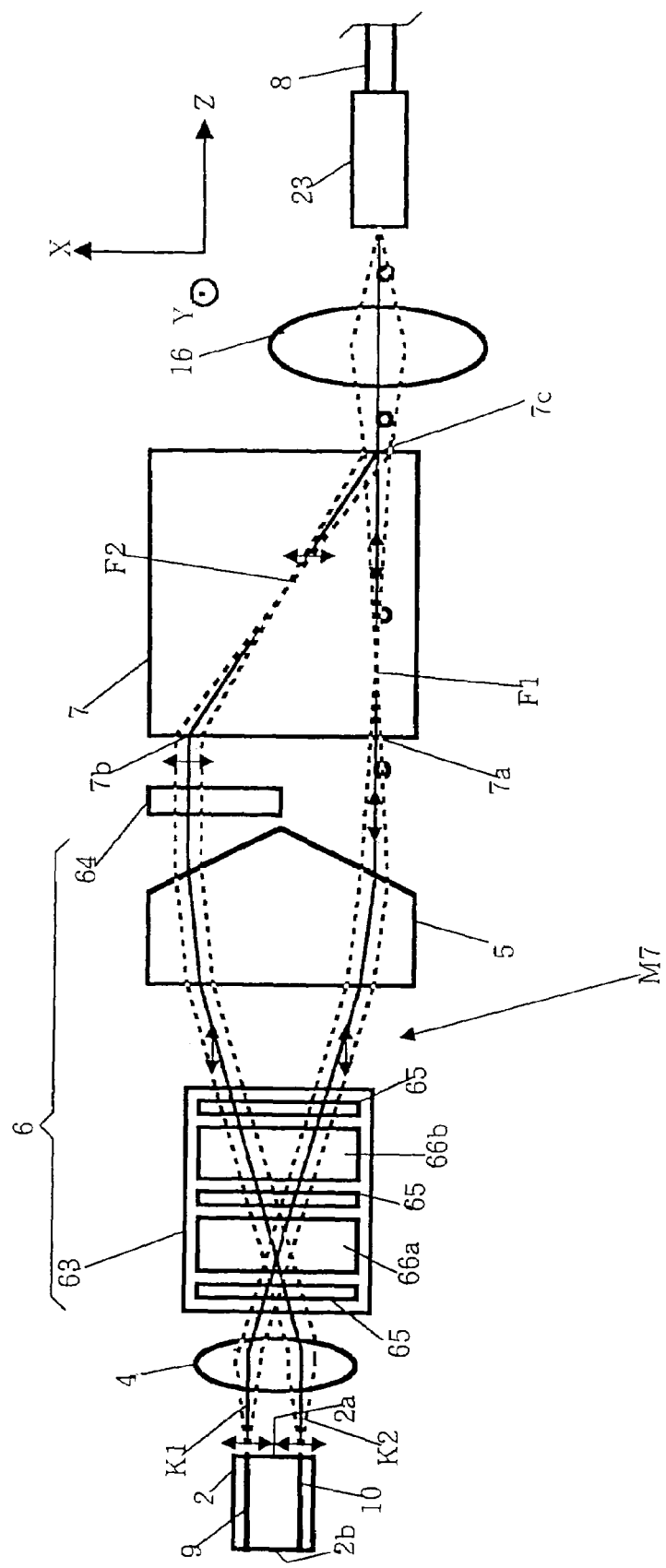
FIG. 16 is an explanatory diagram schematically showing a configuration of a semiconductor laser module in accordance with a fourth embodiment of the present invention.

FIG. 16 is an explanatory diagram schematically showing a configuration of a semiconductor laser module in accordance with a fourth embodiment of the present invention.

As shown in FIG. 16, in the semiconductor laser module M7 according to the fourth embodiment of the present invention, an optical isolator part 63 consists of a polarization dependent optical isolator through which the polarization directions of the first laser beam K1 and the second laser beam K2 incident on the optical isolator part 63 are rotated by (45G2n) degrees in identical azimuthal directions, where n is an integer. In the example of FIG. 16, the optical isolator part 63 is of a semi-double type constituted by two Faraday rotators 66a and 66b each placed between each two of three polarizers 65, and in which n=1, namely the polarization direction of the beam at the output end is rotated by 90 degrees with respect to that at the input end.

The polarization rotating part 64, which is realized as a half wave plate for instance, rotates the polarization direction of the second laser beam K2 by 90 degrees. A prism 5 is disposed between the optical isolator part 63 and the polarization rotating part 64. The other constitutions of the semiconductor laser module are similar to those of the first embodiment.

In the semiconductor laser module M7 according to the fourth embodiment of the present invention, since a semi-double type polarization dependent isolator is utilized as the optical isolator part 63, a high isolation can be assured and a consequent stability of the output laser beam to back reflections results.

Further, in the semiconductor laser module M7, the first laser beam K1, the polarization direction of which having been rotated by 90 degrees by the optical isolator part 63, and the second laser beam K2, the polarization direction of which being substantially unchanged through the optical isolator part 63 and the polarization rotating part 64, enter the first input port 7a and the second input port 7b of the birefringence element 7, respectively. The configuration allows the two beams to propagate through the birefringence element 7 to the output port 7c without each splitting into an ordinary ray and an extraordinary ray on entering the birefringence element 7. Therefore it is free from decrease of optical powers reaching the output port 7c, enabling the semiconductor laser module of high output power to be realized.

Note that a double-type polarization dependent isolator may be used instead as the optical isolator part 63.

Further, if the two Faraday rotators 66a and 66b are configured to rotate the polarization directions of the laser beams in mutually contrary azimuthal directions, the laser beams K1 and K2 at the exit of the optical isolator part 63 are polarized in the same directions as in the case where the optical isolator part 63 is absent. The configuration allows a polarization-synthesizing module 59 of an identical design can be utilized both in the semiconductor laser module with a built-in isolator according to the present invention and in the semiconductor laser module without a built-in isolator, which is advantageous in reducing the parts cost.

FIFTH EMBODIMENT

Figure 17:
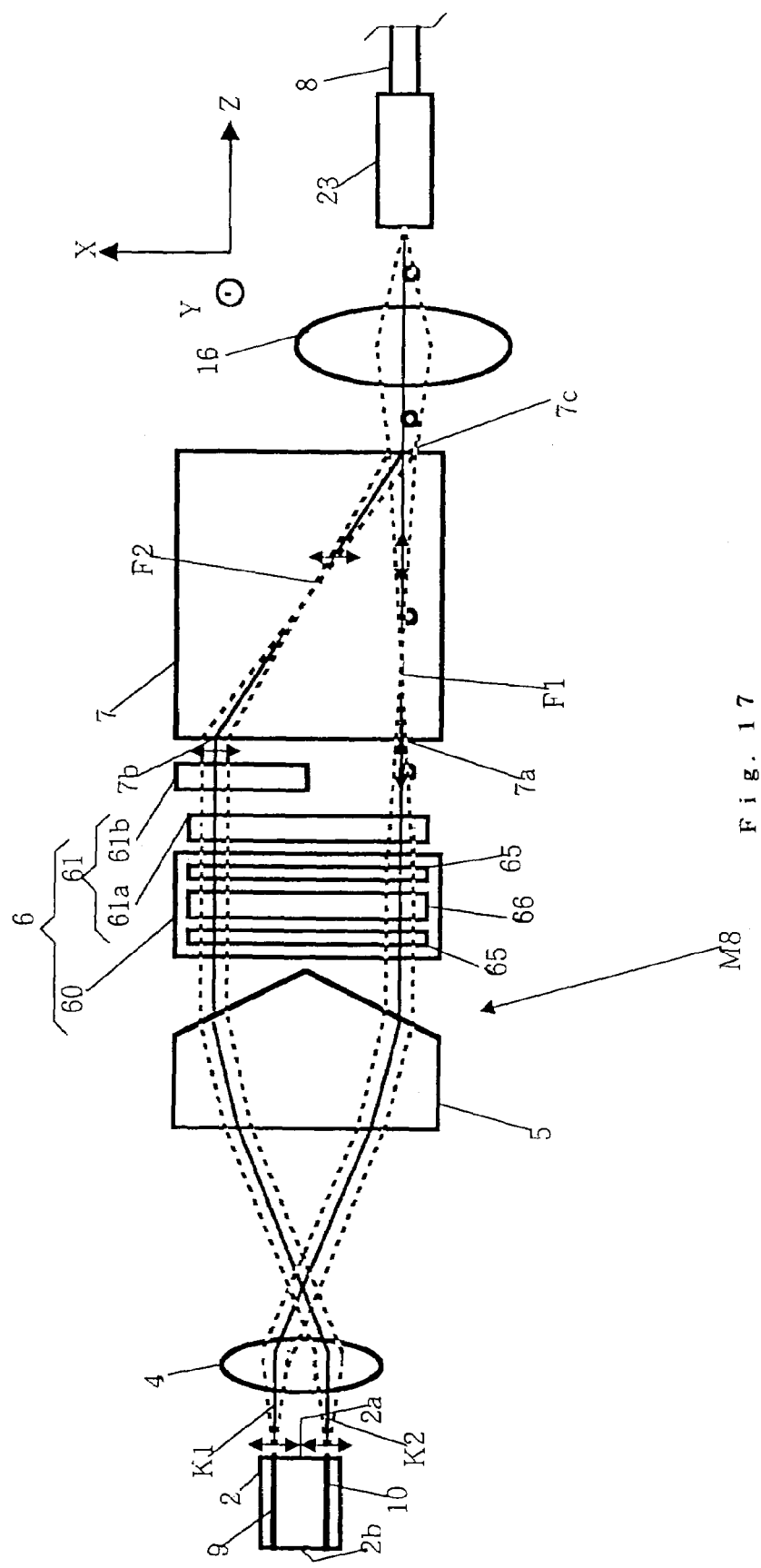
FIG. 17 is an explanatory diagram schematically showing a configuration of a semiconductor laser module M8 in accordance with a fifth embodiment of the present invention.

FIG. 17 is an explanatory diagram schematically showing a configuration of a semiconductor laser module M8 in accordance with a fifth embodiment of the present invention.

The semiconductor laser module M8 according to the fifth embodiment of the present invention is a modified version of the semiconductor laser module M1 according to the first embodiment, in which the prism 5 is disposed between the first lens 4 and the optical isolator part 60. The other constitutions of the semiconductor laser module are similar to those of the first embodiment.

SIXTH EMBODIMENT

Figure 18:
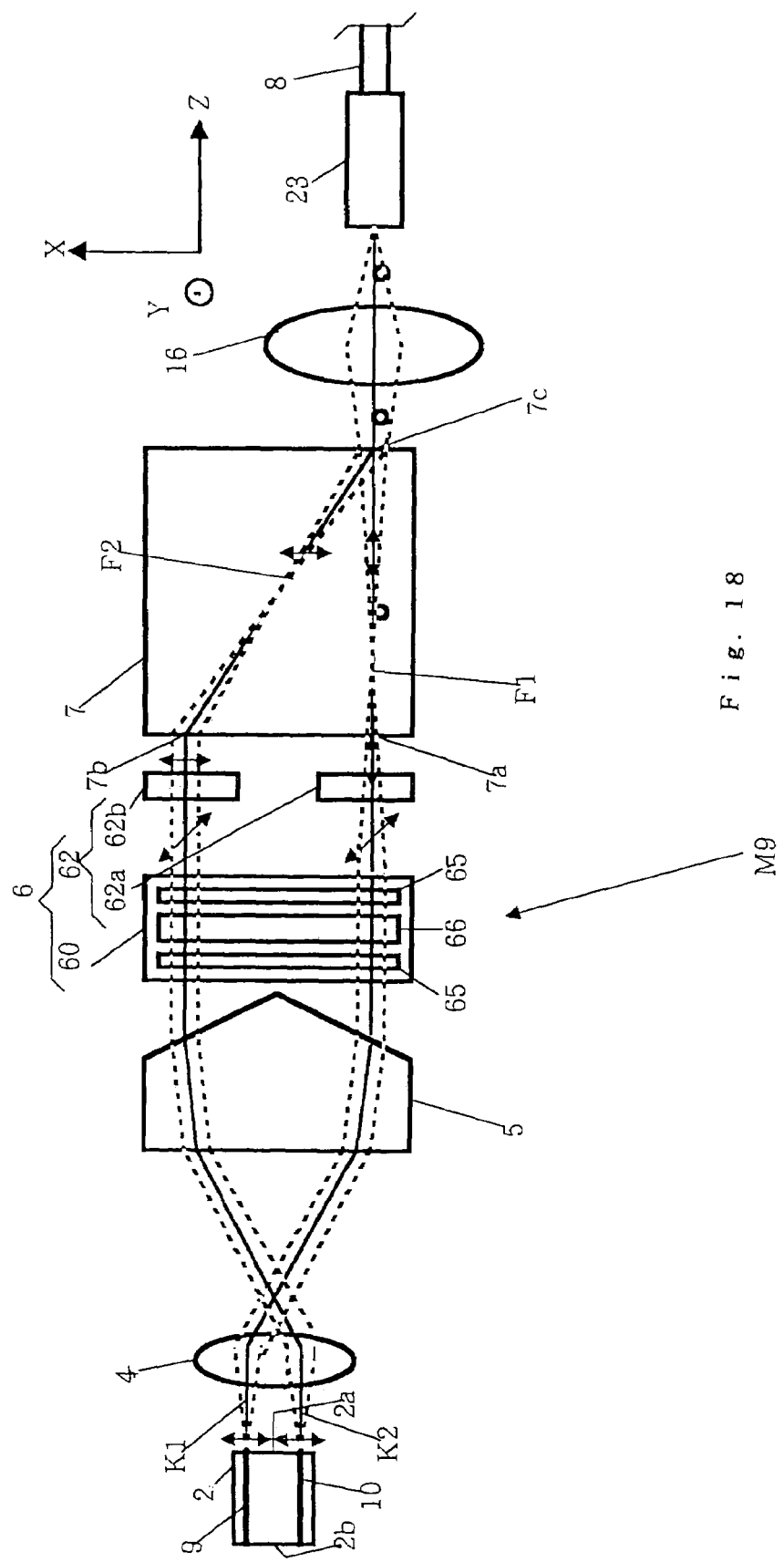
FIG. 18 is an explanatory diagram schematically showing a configuration of a semiconductor laser module M9 in accordance with a sixth embodiment of the present invention.

FIG. 18 is an explanatory diagram schematically showing a configuration of a semiconductor laser module M9 in accordance with a sixth embodiment of the present invention.

The semiconductor laser module M8 according to the sixth embodiment of the present invention is a modified version of the semiconductor laser module M6 according to the third embodiment shown in FIG. 15. In the embodiment, the prism 5 is disposed between the first lens 4 and the optical isolator part 60. The other constitutions of the semiconductor laser module are similar to those of the third embodiment.

SEVENTH EMBODIMENT

Figure 19:
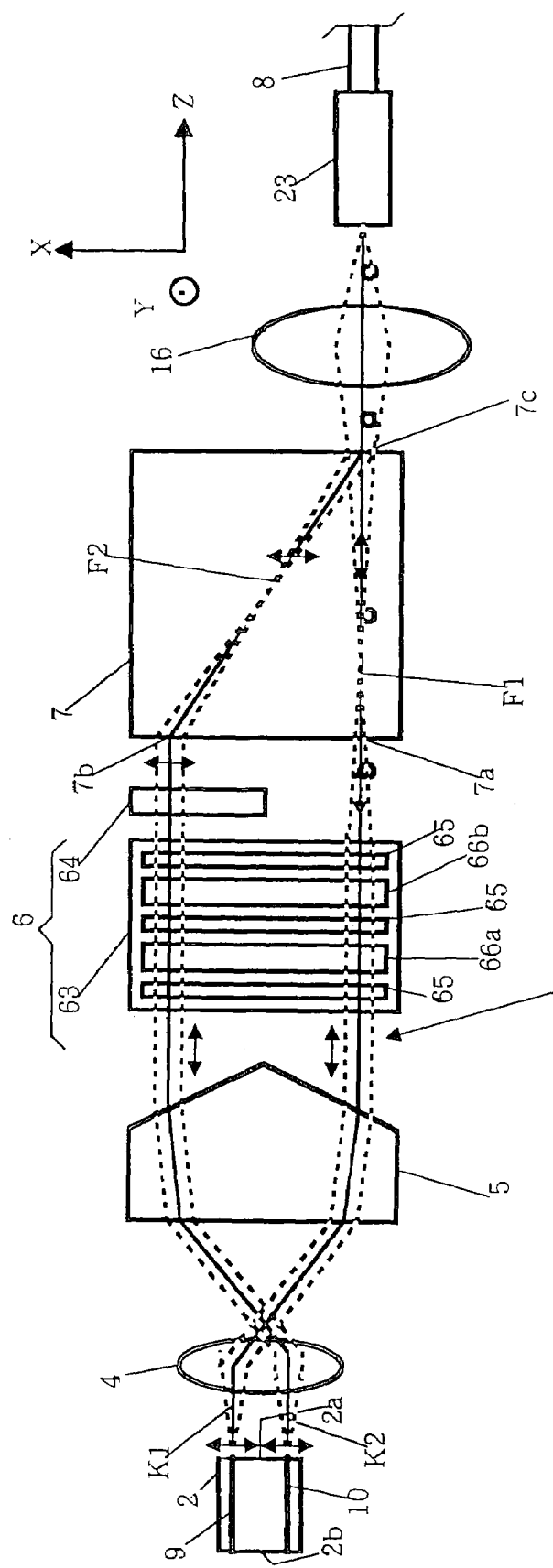
FIG. 19 is an explanatory diagram schematically showing a configuration of a semiconductor laser module M10 in accordance with a seventh embodiment of the present invention.

FIG. 19 is an explanatory diagram schematically showing a configuration of a semiconductor laser module M10 in accordance with a seventh embodiment of the present invention.

The semiconductor laser module M10 according to the seventh embodiment of the present invention is a modified version of the semiconductor laser module M7 according to the fourth embodiment shown in FIG. 16. In the embodiment, the prism 5 is disposed between the first lens 4 and the optical isolator part 63. The other constitutions of the semiconductor laser module are similar to those of the fourth embodiment.

EIGHTH EMBODIMENT

Figure 24:
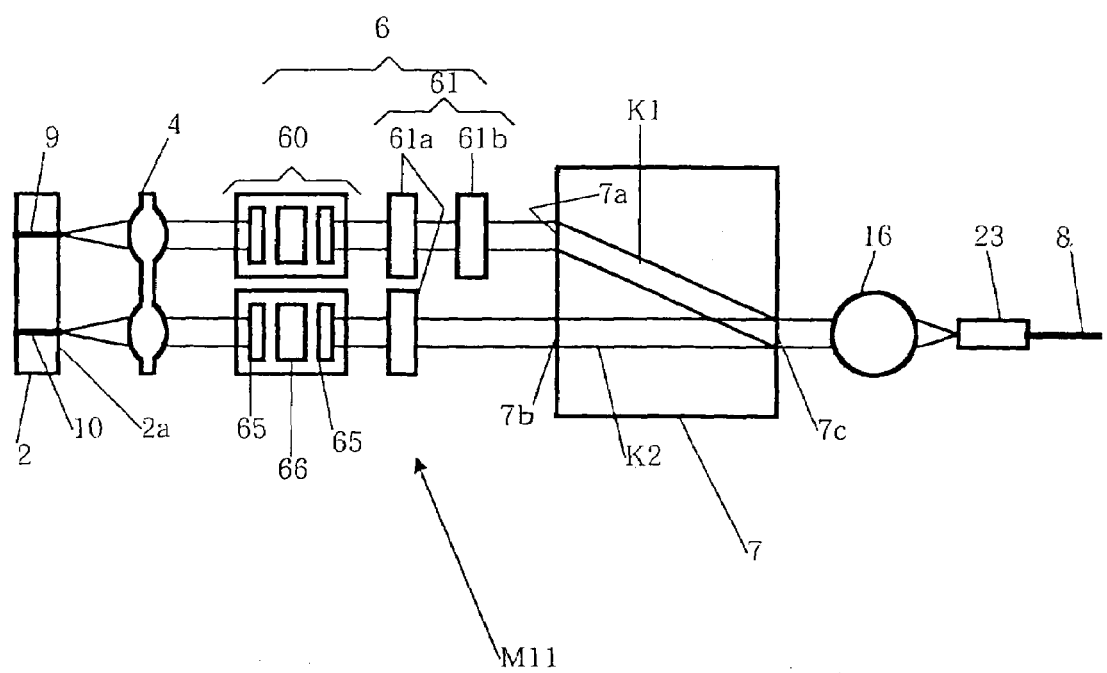
FIG. 24 is an explanatory diagram schematically showing a configuration of a semiconductor laser module M11 in accordance with an eighth embodiment of the present invention.

FIG. 24 is an explanatory diagram schematically showing a configuration of a semiconductor laser module M11 in accordance with a eighth embodiment of the present invention.

The semiconductor laser module M11 according to the eighth embodiment includes: a single semiconductor laser device 2 having a first and a second stripe 9, 10 arranged in parallel to each other with a spacing as large as 500 μm interposed therebetween;

two first lenses 4 respectively configured to collimate the two laser beams K1, K2 emitted from the first and second stripes (in this embodiment, the two first lenses 4 are formed in a lens array); an optical isolator part 60 allowing the first and second laser beams to travel only in one direction; a polarization rotating part 61 consisting of two polarization rotators 61a (a first rotating part) respectively configured to rotate the polarization directions of the first and second laser beams by 45 degrees and a polarization rotator 61b (a second rotating part) configured to rotate the polarization direction of the first laser beam K1 only; a birefringence element 7 for polarization-synthesizing the first and second laser beams; and an optical fiber 8 for receiving the synthesized laser beams emerging from an output port 7c of the birefringence element 7 and transmitting to outside.

In the embodiment shown in FIG. 24, the optical isolator part 60 consists of the two isolators each disposed for each one of the laser beams. It is needless to say, however, that the optical isolator part 60 may consist of a single isolator disposed so as to allow the two laser beams to be transmitted therethrough. Similarly, the first rotating part 61a may consist of a single polarization rotator.

The configuration of the present embodiment, in a similar way to the first through seventh embodiments, allows the two laser beams to propagate through the birefringence element 7 to the output port 7c without each splitting into an ordinary ray and an extraordinary ray on entering the birefringence element 7, and therefore it is free from decrease of optical power reaching the output port 7c. Thus, it is possible to provide a semiconductor laser module of high output power.

In this eighth embodiment, an explanation has been made on only one example of the optical isolator part 60 and the polarization rotating part 61. It goes without saying, however, that various kinds of optical isolator part 60 and polarization rotating part 61, like those shown in the above first through seventh embodiments, can be adopted as long as the two laser beams are orthogonally polarized to each other at the input ports 7a, 7b of the birefringence element 7 and as long as the polarization-synthesized laser beams can be obtained from the output port 7c.

NINTH EMBODIMENT

Figure 25:
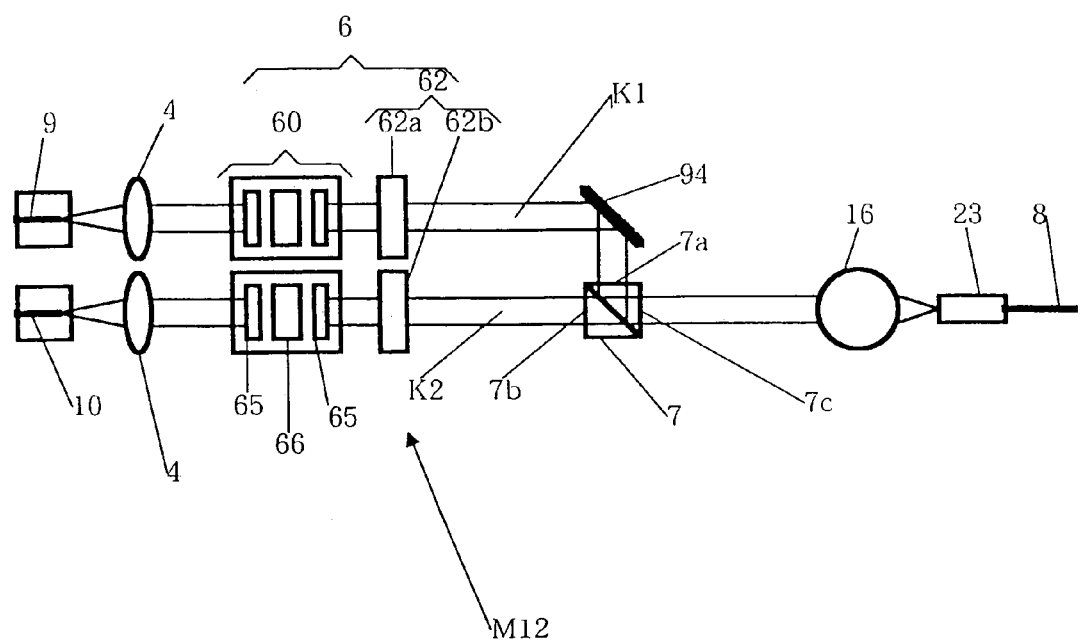
FIG. 25 is an explanatory diagram schematically showing a configuration of a semiconductor laser module M12 in accordance with a ninth embodiment of the present invention.

FIG. 25 is an explanatory diagram schematically showing a configuration of a semiconductor laser module M12 in accordance with a ninth embodiment of the present invention.

The semiconductor laser module M12 according to the ninth embodiment includes:

two semiconductor laser devices 2 respectively having a first and a second stripe 9, 10; two first lenses 4 respectively configured to collimate the two laser beams K1, K2 respectively emitted from the first and second stripes; an optical isolator part 60 allowing the first and second laser beams to travel only in one direction; a polarization rotating part 62 consisting of two polarization rotators 62a, 62b configured to rotate the polarization directions of the first and second laser beams K1, K2 emerging from the optical isolator part 60 by 45 degrees in contrary azimuthal directions to each other; a polarization-synthesizer 7 configured to polarization-synthesize the first and second laser beams; a mirror 94 configured to deflect one of the first and second laser beams to the polarization-synthesizer 7; and an optical fiber 8 for receiving the synthesized laser beams emerging from an output port of the polarization-synthesizer 7 and transmitting to outside.

In the embodiment shown in FIG. 25, the optical isolator part 60 consists of the two isolators each disposed for each one of the laser beams. It is needless to say, however, that the optical isolator part 60 may consist of a single isolator disposed so as to allow the two laser beams to be transmitted therethrough.

The configuration of the present embodiment, in a similar way to the first through eighth embodiments, allows the two laser beams to propagate to the output port 7c without each splitting by their polarization on entering the polarization-synthesizer 7, and therefore it is free from decrease of optical power reaching the output port 7c. Thus, it is possible to provide a semiconductor laser module of high output power.

In this ninth embodiment, an explanation has been made on only one example of the optical isolator part 60 and the polarization rotating part 62. It goes without saying, however, that various kinds of optical isolator part 60 and polarization rotating part 62, like those shown in the above first through eighth embodiments, can be adopted as long as the two laser beams are orthogonally polarized to each other at the input ports 7a, 7b of the polarization-synthesizer 7 and as long as the polarization-synthesized laser beams can be obtained from the output port 7c.

TENTH EMBODIMENT

Figure 26:
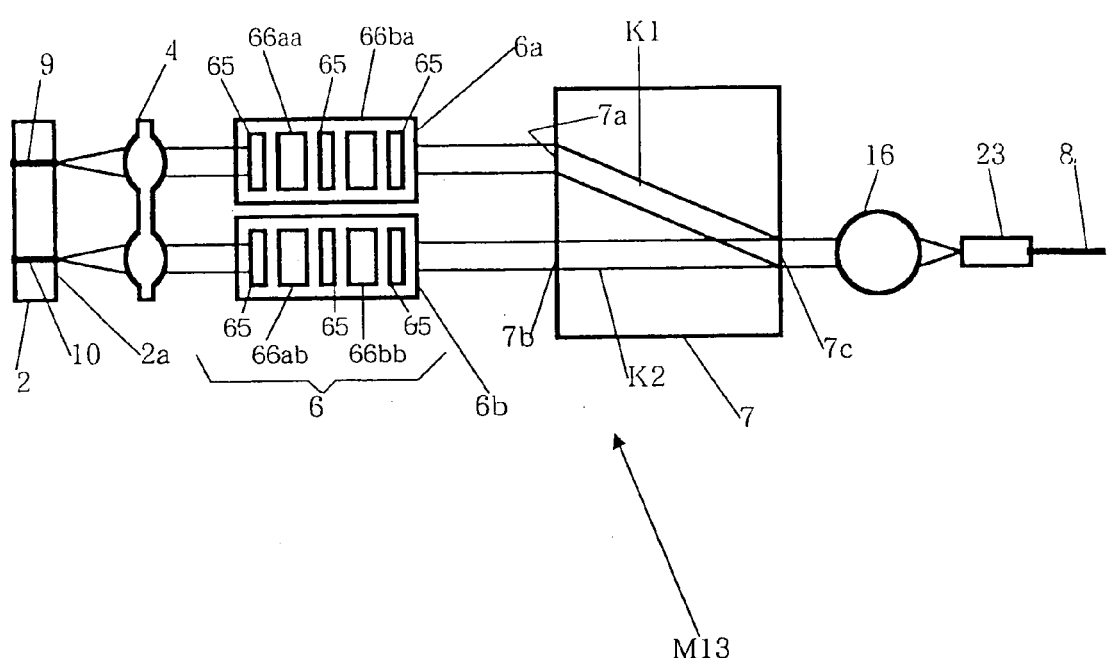
FIG. 26 is an explanatory diagram schematically showing a configuration of a semiconductor laser module M13 in accordance with a tenth embodiment of the present invention.

FIG. 26 is an explanatory diagram schematically showing a semiconductor laser module M13 in accordance with a tenth embodiment of the present invention.

The semiconductor laser module M13 according to the tenth embodiment includes: a single semiconductor laser device 2 having a first and a second stripe 9, 10 arranged in parallel to each other with a spacing as large as 500 μm interposed therebetween;

two first lenses 4 respectively configured to collimate the two laser beams K1, K2 respectively emitted from the first and second stripes (in this embodiment, the two first lenses 4 are formed in a lens array); a polarization direction transforming part 6 consisting of two polarization dependent optical isolators 6a, 6b respectively allowing the first and second laser beams to travel only in one direction; a birefringence element 7 for polarization-synthesizing the first and second laser beams; and an optical fiber 8 for receiving the synthesized laser beams emerging from an output port 7c of the birefringence element 7 and transmitting to outside.

Figure 23A:
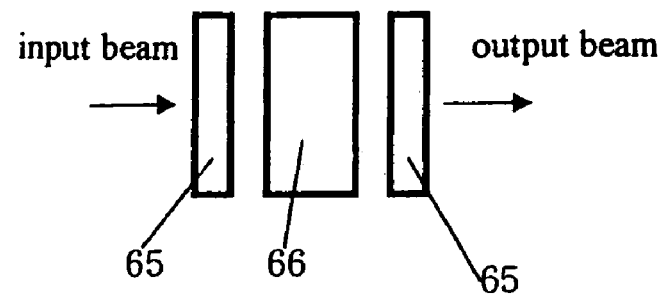
FIG. 23(A) is an explanatory diagram showing a single type polarization dependent isolator.
Figure 23B:
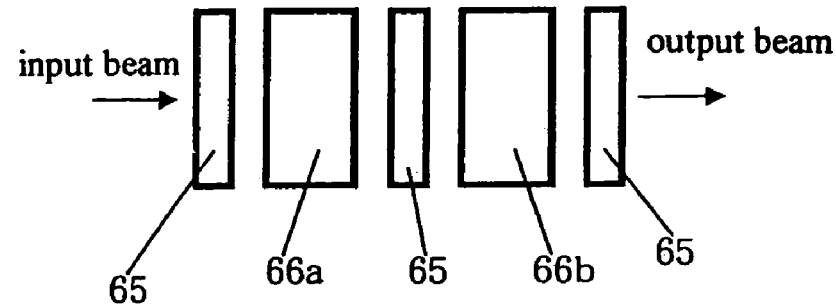
FIG. 23(B) is an explanatory diagram showing a semi-double type polarization dependent isolator.
Figure 23C:
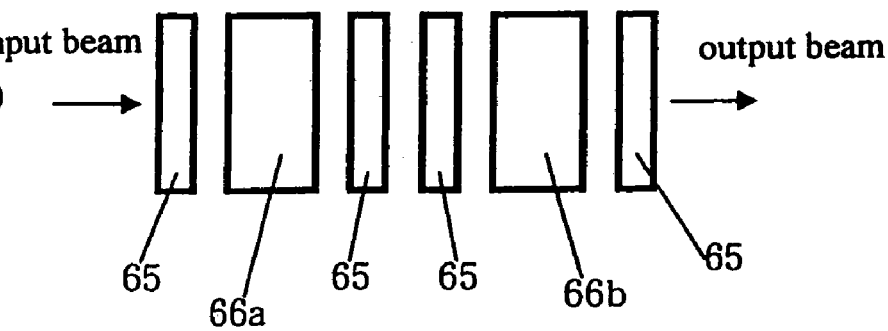
FIG. 23(C) is an explanatory diagram showing a double type polarization dependent isolator.

It should be noted that, in the semiconductor laser module M13 according to the present embodiment, although both of the polarization dependent optical isolator 6a transmitting the first laser beam K1 and the polarization dependent optical isolator 6b transmitting the second laser beam K2 are either of a semi-double type or of a double type as shown in FIGS. 23(B) or (C), they are different from each other in that the polarization direction of the laser beam K1 is not changed after transmitting through the polarization dependent optical isolator 6a while that of the laser beam K2 is rotated by 90 degrees after transmitting through the polarization dependent optical isolator 6b. Since the two polarization dependent optical isolators are constituted in this way, the polarization direction transforming part 6 allows the first laser beam K1 and the second laser beam K2 to travel only in one direction while transforming their polarization directions such that they are orthogonal to each other.

Note that, as previously explained, the semi-double type or double-type polarization dependent optical isolator 6a or 6b can function in the above-described manners by setting the azimuthal directions of polarization-rotation through the Faraday rotators 66ba, 66bb contrary or identical to that of the Faraday rotators 66aa, 66ab, respectively.

The configuration of the present embodiment, in a similar way to the first through ninth embodiments, allows the two laser beams to propagate through the birefringence element 7 to the output port 7c without each splitting into an ordinary ray and an extraordinary ray on entering the birefringence element 7, and therefore it is free from decrease of optical power reaching the output port 7c. Thus it is possible to provide a semiconductor laser module of high output power.

In the tenth embodiment, an example is shown in which the single semiconductor laser device 2 having the first and second stripe 9, 10 and the lens array 4 consisting of two first lenses respectively configured to collimate the two laser beams K1, K2 respectively emitted from the first and second stripes are used. However, the first lenses do not necessarily have to be formed in a lens array. In addition, the semiconductor laser device may be replaced with two discrete devices each having one stripe, as explained in the ninth embodiment.

ELEVENTH EMBODIMENT

In an eleventh embodiment, the semiconductor laser module according to the first through tenth embodiment is applied to a Raman amplifier.

Figure 20:
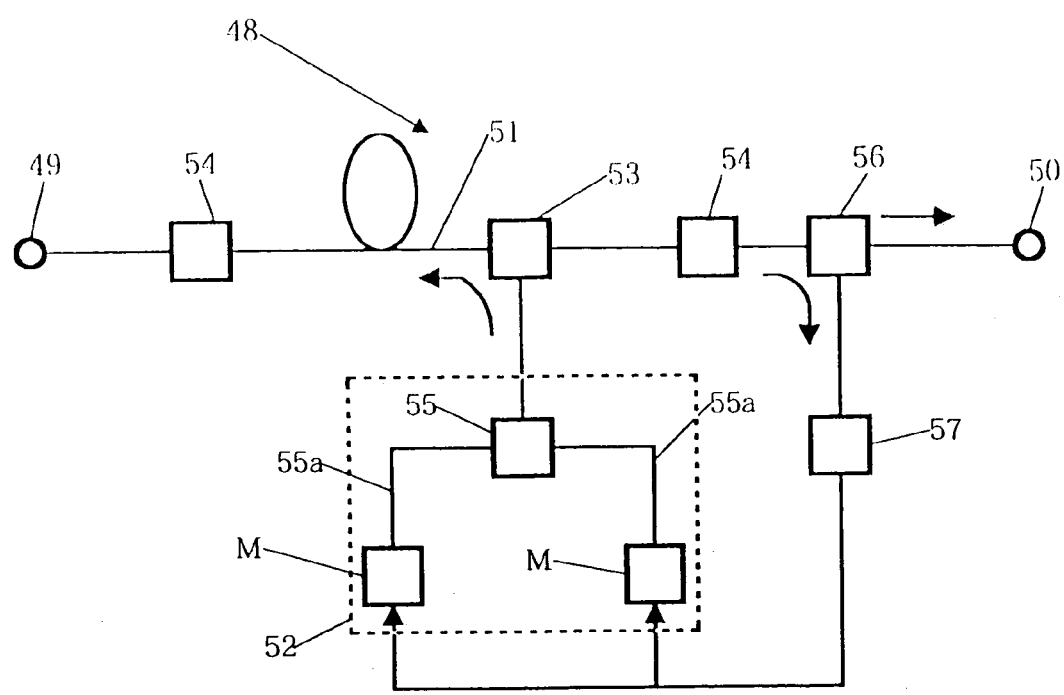
FIG. 20 is a block diagram showing a configuration of a Raman amplifier in accordance with an eleventh embodiment of the present invention.
Figure 22:
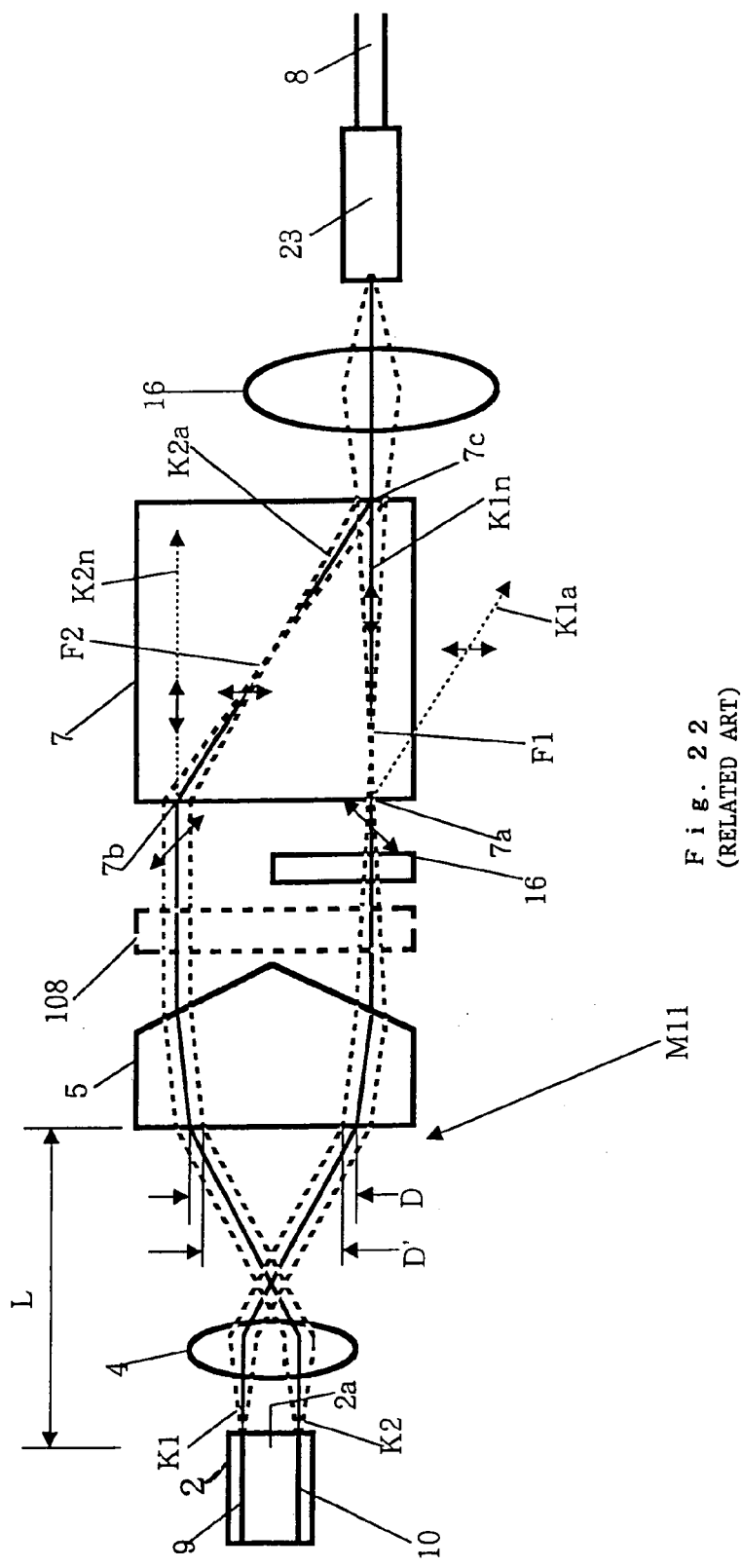
FIG. 22 is an explanatory diagram schematically showing a configuration of a semiconductor laser module of a related art.

FIG. 20 is a block diagram showing a configuration of a Raman amplifier in accordance with the eleventh embodiment of the present invention. The Raman amplifier is used in a WDM transmission communication system, for instance.

As shown in FIG. 20, the Raman amplifier 48 according to the eleventh embodiment of the present invention comprises an input portion 49 to which a signal light is inputted, an output portion 50 from which the signal light is outputted, an optical fiber (an amplification fiber) 51 for transmitting the signal light between the input portion 49 and the output portion 50, a pumping light generating unit 52 for generating a pumping light, and a WDM coupler 53 for coupling the pumping light generated by the pumping light generating unit 52 and the signal light transmitted in the optical fiber (the amplification fiber) 51. Optical isolators 54 are disposed between the input portion 49 and the WDM coupler 53, and between the output portion 50 and the WDM coupler 53 as well, each allowing the signal light to be transmitted only in the direction from the input portion 49 to the output portion 50.

The pumping light generating unit 52 comprises a plurality of the semiconductor laser modules M according to any embodiment of the present invention each generating a laser light of a different wavelength from the others, and a WDM coupler 55 for synthesizing the laser lights generated from the plurality of semiconductor laser modules M.

The pumping lights generated by the semiconductor laser modules M, transmitted through the optical fibers 55a and synthesized by the WDM coupler 55, constitute the output light of the pumping light generating unit 52.

The pumping light outputted from the pumping light generating unit 52 is coupled with the optical fiber 51 through the WDM coupler 53, when the signal light inputted to the input portion 49 is mixed with the pumping light in the optical fiber 51. The signal light is then amplified, transmitted through the WDM coupler 53, and outputted from the output portion 50.

The signal light amplified in the optical fiber 51 (the amplified signal light) is transmitted through the WDM coupler 53 and the optical isolator 54, and then enters a monitor light distribution coupler 56, where a part of the amplified signal light is distributed to a control circuit 57 and the remaining part of it is outputted from the output portion 50 as the output signal light.

The control circuit 57 controls the laser emission state, such as the intensity of optical output of each of the semiconductor laser modules M, on the basis of the part of the inputted amplified optical signal, and performs a feedback control of the semiconductor laser modules M such that a resultant optical amplification gain is flat over the wavelength.

The Raman amplifier 48, since it utilizes the semiconductor laser module in which the output beams from the stripes are polarization-synthesized, is capable of obtaining an amplification gain which is not only high but also stable irrespective of the state of polarization of the signal light.

In addition, if it utilizes the semiconductor laser module as explained in the second embodiment in which the semiconductor laser device further includes diffraction gratings 75 formed within its stripes to oscillate in a plurality of longitudinal modes, it is possible to reduce the noises added onto the amplified signal due to a reduced relative intensity noise (RIN) of the pumping light as compared with the case where the semiconductor laser module with a FBG is used. Still further, it is possible to suppress the occurrence of stimulated Brillouin scattering of the pumping light, whereby the amplification can be performed with low extra noises and high gain.

In FIG. 20, the Raman amplifier is realized as a backward pumped amplifier. However, it should be noted that since the Raman amplifier utilizes the semiconductor laser module emitting a depolarized pumping light of low relative intensity noise (RIN), it is possible to obtain a stable gain irrespective of the state of polarization of the signal light, even if it is realized as any of a forward pumped amplifier or a bi-directional pumped amplifier.

Obviously, the present invention is not limited to the embodiments described above, and additional numerous modifications and variations of the present invention are possible within the scope of the appended claims. Specifically, the present invention may be applicable to a case where the optical isolator part comprises three or more of Faraday rotators.

INDUSTRIAL APPLICABILITY

According to the present invention, the semiconductor laser module includes a polarization direction transforming part for allowing the two laser beams emitted from a semiconductor laser device to travel only in one direction while transforming their polarization directions such that they are orthogonal to each other. Then, the laser beams propagate through the birefringence element to the output port without each splitting into an ordinary ray and an extraordinary ray on entering the birefringence element, and therefore it is free from decrease of optical power reaching the output port. Thus, according to the present invention, high power semiconductor laser modules can be provided.

The invention claimed is:

1. A semiconductor laser module comprising:
   a first stripe and a second stripe formed on a semiconductor substrate, said first stripe and said second stripe being configured to emit respectively a first laser beam and a second laser beam polarized in mutually parallel directions from an end face thereof;
   at least one first lens configured to transmit said first laser beam and said second laser beam emitted respectively from said first stripe and said second stripe;
   a polarization direction transforming part including a polarization dependent optical isolator part, said polarization direction transforming part being configured to transform the polarization directions of said first laser beam and said second laser beam emitted respectively from said first stripe and second stripe such that the polarization direction of said first laser beam and the polarization direction of said second laser beam are orthogonal to each other, said polarization dependent optical isolator part being configured to allow said first laser beam and said second laser beam to travel only in one direction;
   a polarization synthesizer including:
      a first input port on which said first laser beam emerging from said polarization direction transforming part is incident;
      a second input port on which said second laser beam emerging from said polarization direction transforming part is incident; and
      an output port from which said first laser beam emerging from said first input port and second laser beam emerging from said second input port are multiplexed and emitted as a multiplexed laser beam; and
   an optical fiber positioned to receive the multiplexed laser beam therein.

2. The semiconductor laser module according to claim 1, wherein said polarization direction transforming part further includes
   a polarization rotating part configured to rotate the polarization directions of at least one of said first laser beam and said second laser beam such that the polarization direction of said first laser beam and the polarization direction of said second laser beam are orthogonal to each other.

3. The semiconductor laser module according to claim 2, wherein said polarization dependent optical isolator part includes a polarization dependent optical isolator through which the polarization directions of both of said first laser beam and said second laser beam incident on said polarization dependent optical isolator part are rotated by (45×2n) degrees in identical azimuthal directions, where n is an integer, and
- wherein said polarization rotating part is configured to rotate the polarization direction of only one of said first laser beam and second laser beam emerging from said polarization dependent optical isolator part by 90 degrees.

4. The semiconductor laser module according to claim 2, wherein said polarization dependent optical isolator part includes a polarization dependent optical isolator through which the polarization directions of both of said first laser beam and said second laser beam incident on said optical isolator part are rotated by [45×(2m−1)] degrees in identical azimuthal directions, where m is an integer, and
- wherein said polarization rotating part is configured to rotate the polarization directions of said first laser beam and said second laser beam emerging from said polarization dependent optical isolator part by 45 degrees in mutually opposite azumuthal directions.

5. The semiconductor laser module according to claim 2, wherein said polarization dependent optical isolator part includes a polarization dependent optical isolator through which the polarization directions of said first laser beam and second laser beam incident on said optical isolator part are rotated by [45×(2m−1)] degrees in identical azimuthal directions, where m is an integer, and
- wherein said polarization rotating part includes
  - a first rotating part configured to rotate the polarization directions of both of said first laser beam and second laser beam emerging from said optical isolator part by 45 degrees in identical azimuthal directions, and
  - a second rotating part configured to rotate the polarization direction of only one of said first laser beam and second laser beam by 90 degrees.

6. The semiconductor laser module according to claim 5, wherein said polarization dependent optical isolator part and said first rotating part are configured to rotate the polarization in mutually opposite azimuthal directions.

7. The semiconductor laser module according to claim 6, wherein said second rotating part and said polarization synthesizer are fixed to a common holder.

8. The semiconductor laser module according to claim 1, wherein said polarization synthesizer is a birefringence element allowing any one of said first laser beam incident on said first input port and said second laser beam incident on said second input port to travel as an ordinary ray to said output port, while allowing the other to travel as an extraordinary ray to said output port.

9. The semiconductor laser module according to claim 1, wherein said first stripe and said second stripe are arrayed on a single semiconductor substrate with a spacing interposed therebetween to form a single semiconductor laser device.

10. The semiconductor laser module according to claim 9, wherein said at least one first lens consists of a single first lens positioned such that both of said first laser beam and said second laser beam are incident thereon and such that said first laser beam and said second laser beam deflect while traveling away therefrom.

11. The semiconductor laser module according to claim 10, further comprising a prism disposed between said first lens and said polarization synthesizer such that said first laser beam and said second laser beam are incident thereon and emitted therefrom along respective optical axes parallel to each other.

12. The semiconductor laser module according to claim 2, further comprising a prism disposed between said first lens and said polarization synthesizer such that said first laser beam and said second laser beam are incident on said prism and emitted therefrom along respective optical axes parallel to each other,
- wherein said first stripe and said second stripe are arrayed on a single semiconductor substrate with a spacing interposed therebetween to form a single semiconductor device,
- wherein said at least one first lens consists of a single first lens positioned such that both of said first laser beam and said second laser beam are incident thereon and such that said first laser beam and said second laser beam deflect while traveling away therefrom.

13. The semiconductor laser module according to claim 12, wherein said prism is disposed between said polarization dependent optical isolator part and said polarization rotating part.

14. The semiconductor laser module according to claim 12, wherein said prism is disposed between said single first lens and said polarization dependent optical isolator part.

15. The semiconductor laser module according claim 12, wherein said optical isolator part includes a polarization dependent optical isolator through which the polarization directions of said first laser beam and said second laser beam incident on said optical isolator part are rotated by [45×(2m−1)] degrees in identical azimuthal directions, where m is an integer,
- wherein said polarization rotating part includes a first rotating part configured to rotate the polarization directions of both of said first laser beam and said second laser beam emerging from said polarization dependent optical isolator part by 45 degrees in identical azimuthal directions and a second rotating part configured to rotate the polarization direction of only one of said first laser beam and said second laser beam by 90 degrees, and
- wherein said prism is disposed between said first rotating part and said second rotating part of said polarization rotating part.

16. The semiconductor laser module according to claim 2, wherein said prism, said polarization dependent optical isolator part, said polarization rotating part, and said polarization synthesizer are fixed to a common holder.

17. The semiconductor laser module according to claim 2, wherein said polarization dependent optical isolator part includes a single polarization dependent optical isolator configured to allow both of said first laser beam and said second laser beam to travel only in said one direction.

18. The semiconductor laser module according to claim 1, wherein said first stripe and said second stripe include diffraction gratings configured to select a light with a predetermined center wavelength.

19. The semiconductor laser module according to claim 18, wherein said first stripe and said second stripe are configured to emit said first laser beam and said second laser beam respectively having a plurality of longitudinal modes within full width at half maximum of oscillation spectrums.

20. An optical amplifier comprising:
- a semiconductor laser module as a pumping light source for optical amplification, said semiconductor laser module including:
  - a first stripe and a second stripe formed on a semiconductor substrate, said first stripe and second stripe being configured to emit respectively a first laser beam and a second laser beam polarized in mutually parallel directions from an end face thereof;

at least one first lens configured to transmit said first laser beam and said second laser beam emitted respectively from said first stripe and said second stripe;

a polarization direction transforming part having a polarization dependent optical isolator part, said polarization direction transforming part being configured to transform the polarization directions of said first laser beam and said second laser beam emitted respectively from said first stripe and second stripe such that the polarization direction of said first laser beam and the polarization direction of said second laser beam are orthogonal to each other, said polarization dependent optical isolator part being configured to allow said first laser beam and said second laser beam to travel only in one direction;

a polarization synthesizer having:
- a first input port on which said first laser beam emerging from said polarization direction transforming part is incident;
- a second input port on which said second laser beam emerging from said polarization direction transforming part is incident; and
- an output port from which said first laser beam emerging from said first input port and second laser beam emerging from said second input port are multiplexed and emitted as a multiplexed laser beam; and
- an optical fiber positioned to receive the multiplexed laser beam therein;

an amplification fiber; and a WDM coupler configured to couple said multiplexed laser beam generated by said semiconductor laser module to said amplification fiber.

21. The optical amplifier according to claim 20, wherein said first stripe and said second stripe include diffraction gratings configured to select a light with a predetermined center wavelength.

22. The optical amplifier according to claim 20, wherein said pumping light source is used for Raman amplification.

* * * * *